(12) United States Patent
Natori et al.

(10) Patent No.: US 7,391,668 B2
(45) Date of Patent: *Jun. 24, 2008

(54) INTEGRATED CIRCUIT DEVICE AND ELECTRONIC DEVICE

(75) Inventors: Kanji Natori, Fujimi-cho (JP);
Kimihiro Maemura, Suwa (JP);
Takashi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/468,548

(22) Filed: Aug. 30, 2006

(65) Prior Publication Data

US 2007/0057894 A1    Mar. 15, 2007

(30) Foreign Application Priority Data

Sep. 9, 2005   (JP)   ............................ 2005-262389

(51) Int. Cl.
*G11C 8/00*   (2006.01)
(52) U.S. Cl. ..................................... 365/230.03; 365/63
(58) Field of Classification Search .................... 365/63
See application file for complete search history.

(56) References Cited

U.S. PATENT DOCUMENTS

| | | | |
|---|---|---|---|
| 4,935,790 A | 6/1990 | Cappelletti et al. | |
| 6,064,585 A * | 5/2000 | Mori et al. | 365/63 |
| 6,584,031 B2 * | 6/2003 | Fujisawa et al. | 365/226 |
| 6,785,157 B2 * | 8/2004 | Arimoto et al. | 365/149 |
| 7,050,032 B2 | 5/2006 | Tamura | |
| 7,099,199 B2 * | 8/2006 | Seki et al. | 365/185.29 |
| 2004/0120206 A1 * | 6/2004 | Kang | 365/230.03 |
| 2005/0122790 A1 * | 6/2005 | Ueno et al. | 365/189.05 |

FOREIGN PATENT DOCUMENTS

| | | |
|---|---|---|
| JP | A 63-166274 | 7/1988 |
| JP | A 2001-222249 | 8/2001 |

* cited by examiner

*Primary Examiner*—Amir Zarabian
*Assistant Examiner*—Anthan T Tran
(74) *Attorney, Agent, or Firm*—Oliff & Berridge, PLC

(57) ABSTRACT

An integrated circuit device, a first direction being a direction extending from a first side which is a shorter side of the integrated circuit device to a third side opposed to the first side, a second direction being a direction extending from a second side which is a longer side of the integrated circuit device to a fourth side opposed to the second side, includes: a first to a Nth circuit blocks (N is an integer more than 2) arranged in the first direction. One of the first to the Nth circuit blocks is a programmable ROM block in which at least a part of data programmed is stored by a user; the programmable ROM block includes a plurality of word lines, a plurality of bit lines, and a plurality of memory cells connected to the plurality of word lines and the plurality of bit lines; and the plurality of word lines extend in the second direction.

11 Claims, 19 Drawing Sheets

| | MEMORY (RAM) EMBEDDED | | NO MEMORY EMBEDDED | | CSTN | TFD |
|---|---|---|---|---|---|---|
| | AMORPHOUS TFT | LOW-TEMPERATURE POLY-SILICON TFT | AMORPHOUS TFT | LOW-TEMPERATURE POLY-SILICON TFT | | |
| MEMORY(RAM) | ○ | ○ | × | × | ○ | ○ |
| DATA DRIVER | ○ | ○ | ○ | ○ | ○ | ○ |
| SCANNING DRIVER | ○ | × | ○ | × | ○ | ○ |
| LOGIC CIRCUIT(G/A) | ○ | ○ | ○ | ○ | ○ | ○ |
| GRADATION VOLTAGE GENERATING CIRCUIT(γ) | ○ | ○ | ○ | ○ | × | × |
| POWER SUPPLY CIRCUIT | ○ | ○ | ○ | ○ | ○ | ○ |

FIG. 2

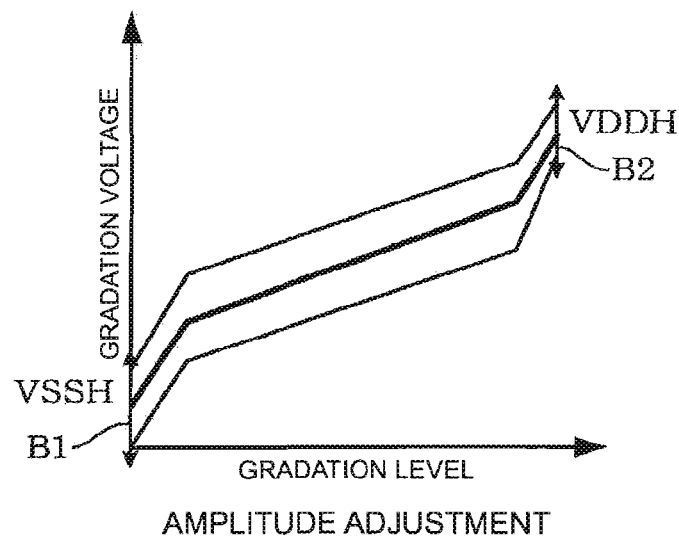
FIG. 6A  AMPLITUDE ADJUSTMENT
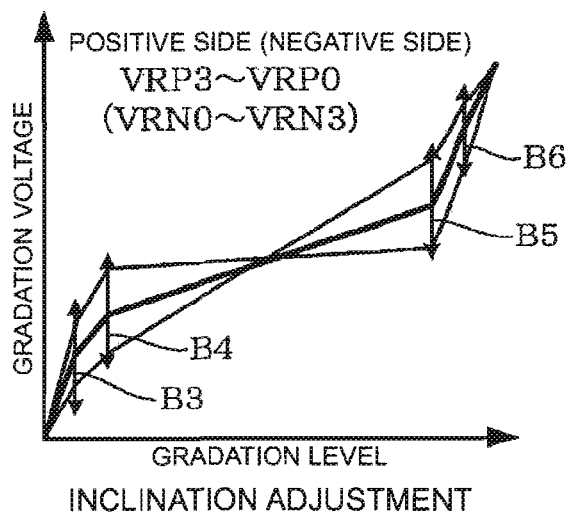
FIG. 6B  INCLINATION ADJUSTMENT
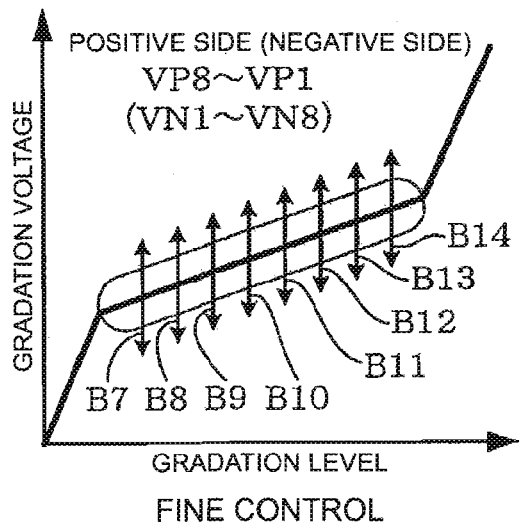
FIG. 6C  FINE CONTROL

INTEGRATED CIRCUIT DEVICE AND ELECTRONIC DEVICE

BACKGROUND OF THE INVENTION

Japanese Patent Application No. 2005-262389 filed on Sep. 9, 2005, is hereby incorporated by reference in its entirety.

1. Technical Field

The present invention relates to an integrated circuit device and an electronic device.

2. Related Art

As an integrated circuit device driving a display panel such as a liquid crystal panel, there is known as a display driver (LCD driver). For this display driver, it is required to reduce chip size in order to achieve reduction in cost.

However, the display panels mounted into, for example, cell-phones have a substantially constant size. Therefore, when a fine designing process is employed and the integrated circuit device of the display driver is merely shrinked to thereby reduce a chip size, there arises a problem in that mounting it on a panel may become difficult.

Further, when the user mounts the display drivers into the liquid crystal panels to thereby manufacture the display devices, various adjustments are necessary at the display driver side. In other words, it is necessary to perform adjustments so as to accommodate the display drivers to the specifications of the panels (for example, an amorphous TFT, a low-temperature poly-silicon TFT, a QCIF, a QVGA, and a VGA) or the specifications of driving conditions. Furthermore, it is necessary to perform adjustment so as to prevent variation in display properties among the panels. Also at the IC manufacturer side, the adjustment of the oscillating frequency or of output voltage, the switching to a redundant memory or the like is needed during the IC test.

Conventionally, the adjustments at the user side have been performed by an external Electrical Erasable Programmable Read Only Memory ($E^2PROM$) or an external trimmer resistance (variable resistance). The switching to the redundant memory or the like at the IC manufacturer side has been performed by blowing out a fuse element provided inside the integrated circuit device.

However, the mounting work of the components is complicated for the user. Moreover, there is a disadvantage in that the trimmer resistance is expensive, large, and apt to be broken. Also at the IC manufacturer side, the blowing out of the fuse element and the work for operation test thereafter are complicated.

In view of the above, JP-A-S63-166274 has been proposed a nonvolatile memory device which can be manufactured in easier manufacturing process and at a lower cost as compared to a stack gate type nonvolatile memory device having two gates. In the nonvolatile memory device according to JP-A-63-166274, a control gate is an N type impurity region inside a semiconductor layer, and a floating gate electrode is composed of a conductive layer such as a single layer poly-silicon (hereinafter, the nonvolatile memory device according to JP-A-63-166274 is also referred to as a "single layer gate type nonvolatile memory device"). Such the single layer gate type nonvolatile memory device does not require the gate electrodes stacked, so it can be formed in a process for a normal CMOS transistor.

JP-A-2001-222249 is an example of related art.

SUMMARY

An advantage of the present invention is to provide an integrated circuit device and an electronic device having the same, the integrated circuit device being capable of eliminating the need for the external components or the fuse elements, and storing therein the adjustment data mainly set by a user, and further enhancing the efficiency in design upon changing memory capacity.

An integrated circuit device according to one aspect of the invention, a first direction being a direction extending from a first side which is a shorter side of the integrated circuit device to a third side opposed to the first side, a second direction being a direction extending from a second side which is a longer side of the integrated circuit device to a fourth side opposed to the second side, includes: a first to a Nth circuit blocks (N is an integer more than 2) arranged in the first direction, wherein: one of the first to the Nth circuit blocks is a programmable ROM block in which at least a part of data programmed is stored by a user; the programmable ROM block includes a plurality of word lines, a plurality of bit lines, and a plurality of memory cells connected to the plurality of word lines and the plurality of bit lines; and the plurality of word lines extend in the second direction.

In the above-mentioned integrated circuit device, the first to the Nth circuit blocks are arranged in the first direction, and one of the first to the Nth circuit blocks is the programmable ROM block. By storing the adjustment data in the programmable ROM block, the need for the external components or the fuse elements is eliminated. The word lines of the programmable ROM block extend in the shorter side direction (second direction) of the integrated circuit device. When the memory capacity of the programmable ROM block is increased, it is sufficient that the number of the word lines in the longer side direction (first direction) is increased. Therefore, there is no influence on the dimension of the shorter side direction (second direction), thereby making it possible to make the width of the integrated circuit device in the second direction and to provide a slim elongated integrated circuit device.

The data read from the programmable ROM is input in other circuit blocks. At this time, the plurality of bit lines extend in the longer side direction (first direction), so the data output direction is the first direction. Therefore, it is possible to supply the adjustment data to the other circuit blocks arranged in the first direction through short path.

In the above-mentioned aspect of the present invention, the programmable ROM block may include a memory cell array block in which the plurality of memory cells are arranged, and a control circuit block that controls programming, erasing and reading of data to the plurality of memory cells; and the memory cell array block and the control circuit block may be adjacent to each other in the first direction.

With this, it is possible to supply the adjustment data through short path to the other circuit blocks, which are adjacent to the control circuit block and arranged in the first direction without involving unnecessary run length from the control circuit block. Further, even if the memory capacity of the programmable ROM is increased, it is sufficient that the number of the word lines is increased in the longer side direction (first direction). Therefore, there is substantially no need for changing the control circuit block itself, and it is possible to enhance the efficiency in design of various type having different memory capacities.

In the above-mentioned aspect of the present invention, the memory cell array block may be divided into a first region and the second region at a center region in the second direction, and two word line drivers respectively driving the plurality of word lines of the first region and of the second region, and two control gate drivers respectively driving the control gates of each of the plurality of memory cells respectively arranged in the first region and the second region may be arranged in the memory cell array block.

With this, it is possible to prevent the signal delay by reducing the length of the word lines and the control gate by one-half and to drive at the minimum distance from each of the drivers.

In this case, the two word line drivers and the two control gate drivers may be arranged in the center region. In the above-mentioned aspect of the present invention, the memory cell array block may have a plurality of column blocks divided in the second direction, each of the plurality of word lines may be hierarchized into main word lines and a plurality of sub word lines belonging to the main word line, the respective one of the plurality of sub word lines being arranged in each of the plurality of column blocks, the word line driver arranged in the center region may be the main word line driver, and each of the plurality of column blocks may have a memory cell region and a sub word line decoder region further divided in the second direction, a sub word line decoder being arranged in the sub word line decoder region, the sub word line decoder selectively driving one of the plurality of sub word lines belonging to the main word line based on a state of the main word line.

With this, a specific sub word line of the plurality of sub word lines can be selectively driven.

In the above-mentioned aspect of the present invention, the control gate circuit block may be provided with a plurality of column drivers which are arranged to respectively correspond to each of the plurality of column blocks, each of the plurality of column drivers may select simultaneously the sub word line decoder connected to each of the plurality of main word lines arranged in one of the column blocks to which one of the plurality of column blocks corresponds, and one of the plurality of main word lines may be activated upon one of data programming and data reading to perform one of programming operation and reading operation for at least one of the memory cells connected to one of the sub word lines.

It is possible to set one of the plurality of sub word line decoders arranged in a matrix manner by selecting the main word line and the column block upon data programming or data reading.

In the above-mentioned aspect of the present invention, each of the plurality of memory cells may have a write/read transistor formed on the semiconductor substrate and a floating gate which is common for each gate of an erase transistor, and the floating gate may have a single layer gate structure which is opposed to, via an insulating film, a control gate formed by an impurity layer formed in the semiconductor substrate.

By thus separating the erase transistor and the write/read transistor and by making the conductive types of the channels, it is possible to increase breakdown voltage against the erase voltage which is relatively high voltage as compared to the case in which the same transistor performs erasing, writing and reading.

In the above-mentioned aspect of the present invention, the common well region may have a triple structure, and when the semiconductor substrate is a first conductive type, the common well region may have a second conductive type deep layer well formed in the semiconductor substrate, a first conductive type surface well formed on the second conductive type deep layer well, a second conductive type annular surface well surrounding the first conductive type surface well on the second conductive type deep layer well, and an uppermost impurity region formed on the first conductive type surface well and the second conductive type annular surface well.

By surrounding the first conductive type surface well with the second conductive type annular surface well, and by arranging the second conductive type deep layer well under those, it becomes possible to electrically separate the first conductive type surface well from the semiconductor substrate and to set the different potentials for the both.

In the above-mentioned aspect of the present invention, the erase transistor may be formed in the second conductive type annular surface well, and the control gate and the write/read transistor may be formed in the first conductive type surface well.

In the above-mentioned aspect of the present invention, the first conductive type surface well and the second conductive type annular surface well may be spaced apart from each other, and the second conductive type deep layer well may be formed between the first conductive type surface well and the second conductive annular surface well.

By thus separating the second conductive type annular surface well on which the erase transistor driven at relatively high voltage from the first conductive type surface well, it is possible to form the breakdown voltage structure. Further, the second conductive type deep layer well is formed in a separating space, so even if a wiring which may become a gate for a parasitic transistor straddles over the separating space, the parasitic transistor cannot be turned on and the potential of the separating space cannot be inverted.

In the above-mentioned aspect of the present invention, the integrated circuit device may further include a transfer gate between the write/read transistor and the bit lines, the transfer gate being composed of a first conductive type transistor and a second conductive type transistor.

In this case, the second conductive type transistor can be formed in the first conductive type surface well.

Furthermore, the second conductive type annular surface well may have two longer side regions, the erase transistor may be formed on one of the two longer side regions, a second conductive type stripe-shaped surface well may be formed to be adjacent to another of the two longer side regions, and the first conductive type transistor may be formed in the second conductive type stripe-shaped surface well. Concerning the breakdown voltage, it is possible to separate the other of the two longer side region and the second conductive type stripe-shaped surface well from each other.

Note that further one of the first to the Nth circuit blocks is a gate array block (logic circuit block), and it is possible to arrange the programmable ROM so as to be adjacent to the gate array in the first direction.

The gate array is a candidate of the read source of the data of the programmable ROM. The resistor in which various adjustment values are stored is formed by the gate array and can be read the adjustment values stored in the programmable ROM to the resistor. At this time, it is possible to arrange the programmable ROM and the gate array so as to be adjacent to each other, thereby connecting the both though short path.

Alternatively, yet further one of the first to the Nth circuit blocks is the power supply circuit, and the programmable ROM can be arranged so as to be adjacent to the power supply circuit in the first direction.

The power supply circuit is a candidate of the read source of the data of the programmable ROM. The power supply circuit may include a resistor in which the adjustment values for adjusting, for example, output voltage are stored and can read the adjustment values stored in the programmable ROM to the resistor. At this time, it is possible to arrange the programmable ROM and the power supply circuit so as to be adjacent to each other, thereby connecting the both through short path.

In any case, it is preferable that the control circuit block in the programmable ROM be arranged so as to be adjacent to the gate array or the power supply circuit in the first direction. This is because the control circuit block has a data output circuit.

Further, in the above-mentioned aspect of the present invention, the integrated circuit device may further include a first interface region provided along the fourth side at the second direction side of the first to the Nth circuit blocks, and a second interface region provided along the second side at a fourth direction side of the first to Nth circuit blocks, the fourth direction being a direction opposed to the second direction.

According to another aspect of the present invention, there is provided an electronic device including an integrated circuit device described above and display panel driven by the integrated circuit device.

BRIEF DESCRIPTION OF THE DRAWINGS

The invention will be described with reference to the accompanying drawings, wherein like numbers reference like elements.

FIG. 2 is a table listing various types of display drivers and examples of circuit blocks, which are embedded therein.

FIG. 6A is a plot of the properties for showing the gradation voltage which is adjusted by the circuits of FIG. 5.

FIG. 6B is a plot of the properties for showing the gradation voltage which is adjusted by the circuits of FIG. 5.

FIG. 6C is a plot of the properties for showing the gradation voltage which is adjusted by the circuits of FIG. 5.

DESCRIPTION OF EXEMPLARY EMBODIMENTS

An embodiment of the invention will be described in detail. It should be noted that the embodiment described below do not restrict disadvantageously the content of the present invention recited in the scope of the claims and not all of the constructions described with reference to the following embodiment are necessary as solving means of the present invention.

1. Construction of Integrated Circuit Device

Figure 1:
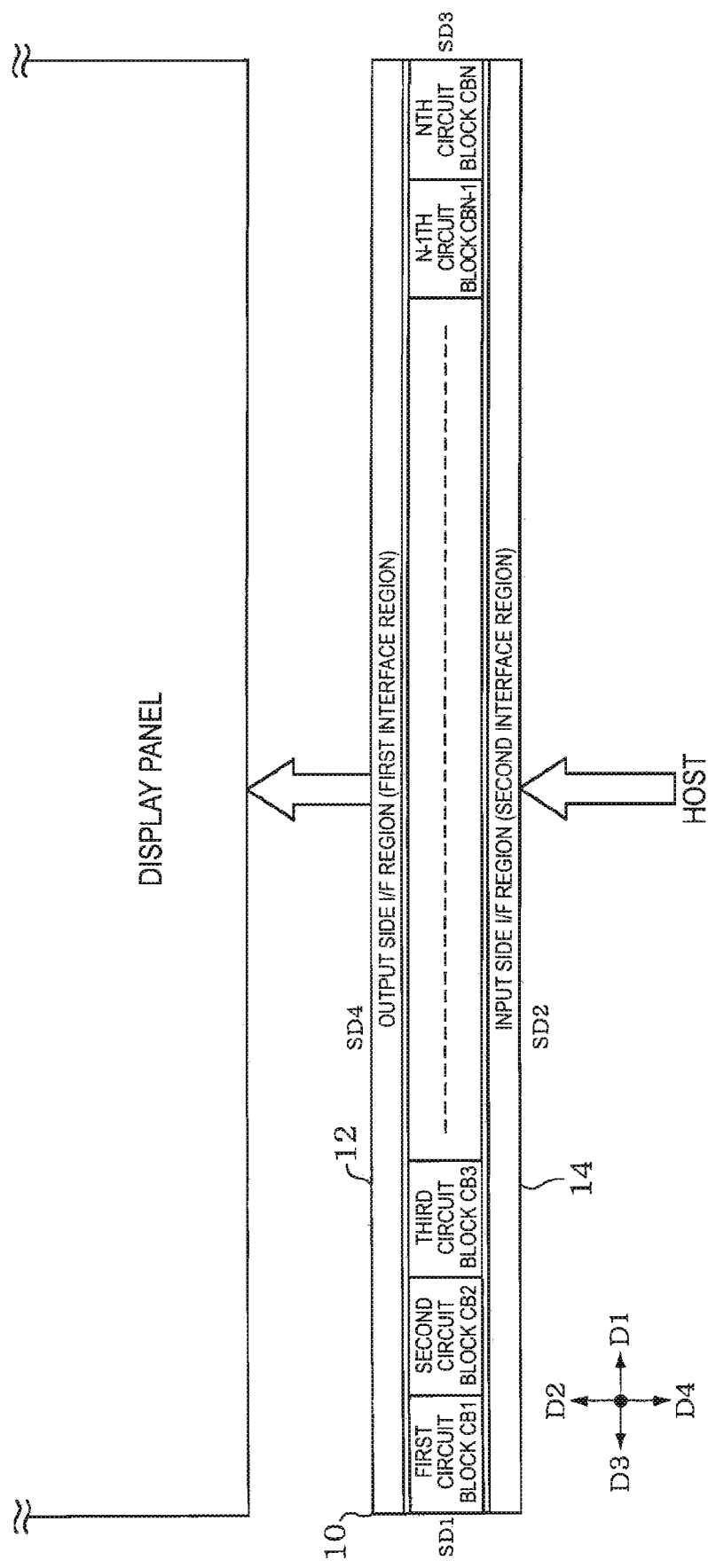
FIG. 1 is a view showing a construction example of the integrated circuit device according to an embodiment of the present invention.

A construction example of an integrated circuit device 10 according to this embodiment is shown in FIG. 1. According to this embodiment, the direction, which extends from the first side SD1 as the shorter side of the integrated circuit device 10 to the third side SD3, which is opposed to the first side SD1, is called the first direction D1, and the direction opposed to D1 is called the third direction D3. Further, the direction, which extends from the second side SD2 as the longer side of the integrated circuit device 10 to the fourth side SD4 opposed to the second side SD2, is called the second direction D2, and the direction opposed to the D2 is called the fourth direction D4. In FIG. 1, the left side of the integrated circuit device 10 corresponds to the first side SD1, and the right side corresponds to the third side SD3. However, the left side may be the third side SD3 and the right side may be the first side SD1.

As shown in FIG. 1, the integrated circuit device 10 according to this embodiment includes a first to an Nth circuit blocks CB1~CBN (N is an integer larger than one), which arranged along the direction D1. According to this embodiment, the circuit blocks CB1~CBN are aligned side by side in the direction D1. The first to the Nth circuit blocks CB1~CBN are described later in greater detail.

Further, the integrated circuit device 10 includes an output side I/F region 12 (which is broadly interpreted to be a first interface region) arranged along a side SD4 in the D2 direction side of the first to the Nth circuit blocks CB1~CBN. Further, the integrated circuit device 10 includes an input side I/F region 14 (which is broadly interpreted to be a second interface region) arranged along a side SD2 in the D4 direction side of the first to the Nth circuit blocks CB1~CBN. To be more specific, the output side I/F region 12 (first interface region) is arranged in the D2 direction side of the circuit blocks CB1~CBN with, for example, other circuit blocks being not interposed. Further, the input side I/F region 14 (second interface region) is arranged in the D2 direction side of the circuit blocks CB1~CBN with, for example, other circuit blocks being not interposed. When, for example, the integrated circuit device 10 is used as an Intellectual Property (IP) core to be integrated in the other integrated circuit device, it is also possible to omit at least one of the I/F regions 12 and 14.

The output side (display panel side) I/F region 12 is the region serving as an interface to the display panel, and includes various elements such as a pad, transistor for output connected to the pad, and a protective element. When the display panel is a touch panel or the like, the output side I/F region 12 may include a transistor for input.

The input side (host side) I/F region 14 is the region serving as an interface to a host (MPU or image processing controller or base band engine), and may include various elements such as a pad, a transistor for input (for input and output), a transistor for output, and a protective element.

It is also possible to provide the output side I/F region or the input side I/F region along the shorter side SD1 or SD3.

Further, the first to the Nth circuit blocks CB1~CBN may include at least 2 (or 3) different circuit blocks (circuit blocks having the different functions). In this embodiment in which the integrated circuit device 10 is a display driver, a programmable ROM logic is indispensable. Further, at least one of a logic circuit (which is broadly interpreted to be a gate array block) which is the destination of data from the programmable ROM logic and a power supply circuit is indispensable.

In FIG. 2, there are listed, for example, various types of the display drivers and the circuit blocks embedded therein. In the display driver for an amorphous Thin Film Transistor (TFT) with memory (RAM) embedded, the circuit blocks CB1~CBN include, besides a programmable ROM block, a display memory, a data driver (source driver), a scanning driver (gate driver), a logic driver (gate array circuit), a gradation voltage generating circuit (y correction circuit) and a block for power supply circuit. On the other hand, in a display driver for a low-temperature poly-silicon (LTPS) TFT panel with memory embedded, it is possible to form the scanning driver on a glass substrate. Therefore, the block for the scanning driver can be omitted. Further, in the display driver for an amorphous TFT panel without memory embedded, it is possible to omit the block for the memory. Furthermore, in the display driver for a low-temperature poly-silicon TFT panel without memory embedded, it is possible to omit the block for the memory and the block for the scanning driver. Moreover, in the display driver for a Color Super Twisted Nematic (CSTN) panel and the display driver for a Thin Film Diode (TFD) panel, it is possible to omit the block for the gradation voltage generating circuit.

Figure 3A:
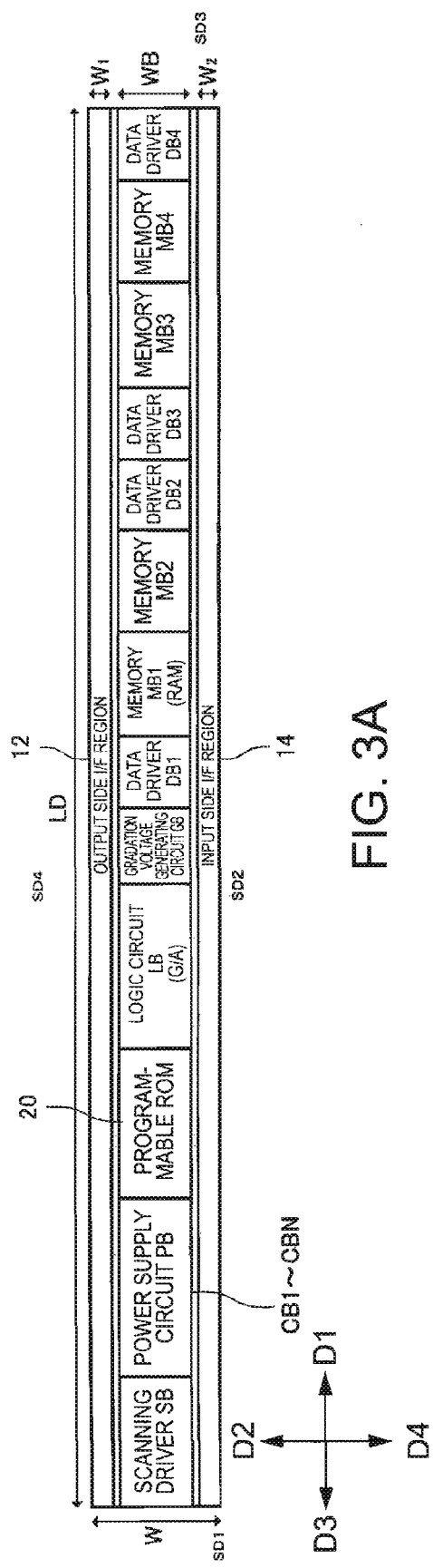
FIG. 3A is a view showing an example of the plane layout of the integrated circuit device according to the embodiment.
Figure 3B:
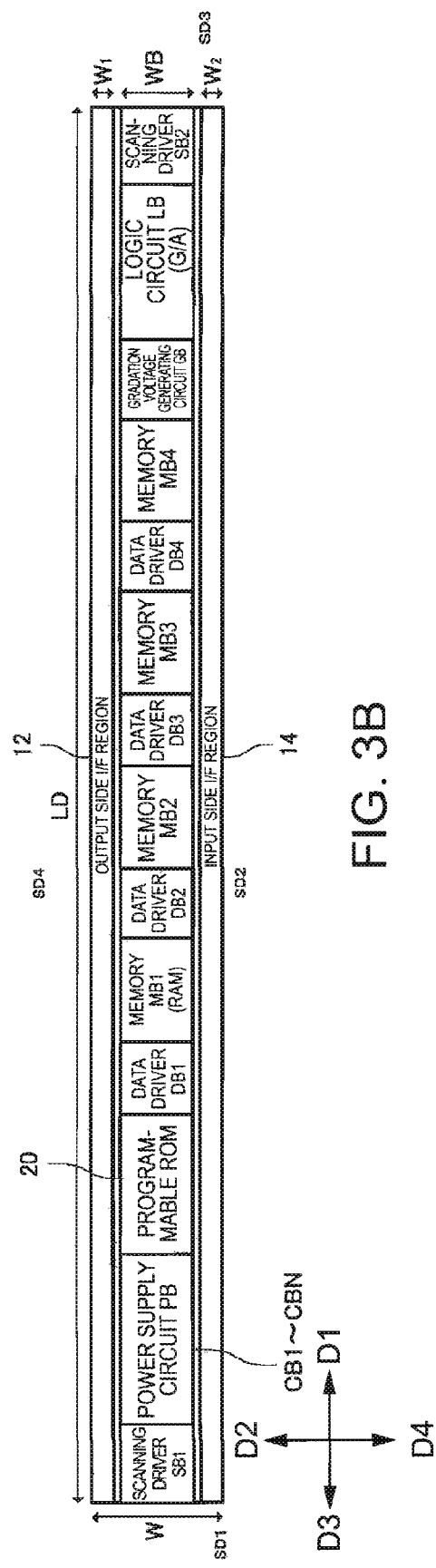
FIG. 3B is a view showing an example of the plane layout of the integrated circuit device according to the embodiment.

FIGS. 3A and 3B show an example of a plane layout of the integrated circuit device 10 of the display driver according to this embodiment. FIGS. 3A and 3B show an example of the display driver for an amorphous TFT panel with memory embedded. The example shown in FIG. 3A is the display driver for, for example, QCIF, i.e. 32 gradations, while the example shown in FIG. 3B is the display driver for, for example, QVGA, i.e. 64 gradations.

In FIG. 3A, a programmable ROM 20 is provided between the power supply circuit PB and the logic circuit LB. In other words, the programmable ROM 20 is adjacent to the respective blocks of the power supply circuit PB and the logic circuit LB in the D1 direction.

On the other hand, in FIG. 3B, the block for the programmable ROM 20 is adjacent to the block of the power supply circuit PB in the D1 direction.

This is because the data read from the programmable ROM 20 is mainly destined for the power supply circuit PB and or the logic circuit LB. That is to say, the data from the programmable ROM 20 can be supplied to the power supply circuit PB and/or the logic circuit LB through a short path. Note that the data read from the programmable ROM 20 will be described later.

In FIGS. 3A and 3B, there are shown, besides three blocks described above, memories MB1~MB4 in which the display data is stored, data drivers DB1~DB4 arranged so as to adjacent to the respective memories, the gradation voltage generating circuit GB, and one or two scanning driver(s) SB (SB1, SB2).

According to the layout arrangement shown in FIG. 3A, there is such an advantage that the memory blocks MB1 and MB2, or MB3 and MB4 can share a column address decoder. On the other hand, according to the layout arrangement shown in FIG. 3B, it is possible to make a wiring pitch of data signal output lines from the data driver blocks DB1~DB4 to the output side I/F region 12, thereby making it possible to advantageously enhance the efficiency in wiring.

It should be noted that the layout arrangement of the integrated circuit device 10 of this embodiment is not limited to the examples of FIGS. 3A and 3B as long as the block of the programmable ROM 20 is adjacent to the logic circuit LB and/or the power supply circuit PB in the D1 direction. Further, it is also possible to provide a circuit block having very short width (a narrow circuit block having the width shorter than WB) in the D2 direction respectively between the circuit blocks CB1~CBN and the output side I/F region 12 or the circuit blocks CB1~CBN and the input side I/F region 14. Furthermore, the circuit blocks CB1~CBN may include the circuit blocks arranged in a multistage manner in the D2 direction. For example, it is also possible to provide the scanning driver circuit and the power supply circuit as one circuit block.

Figure 4A:
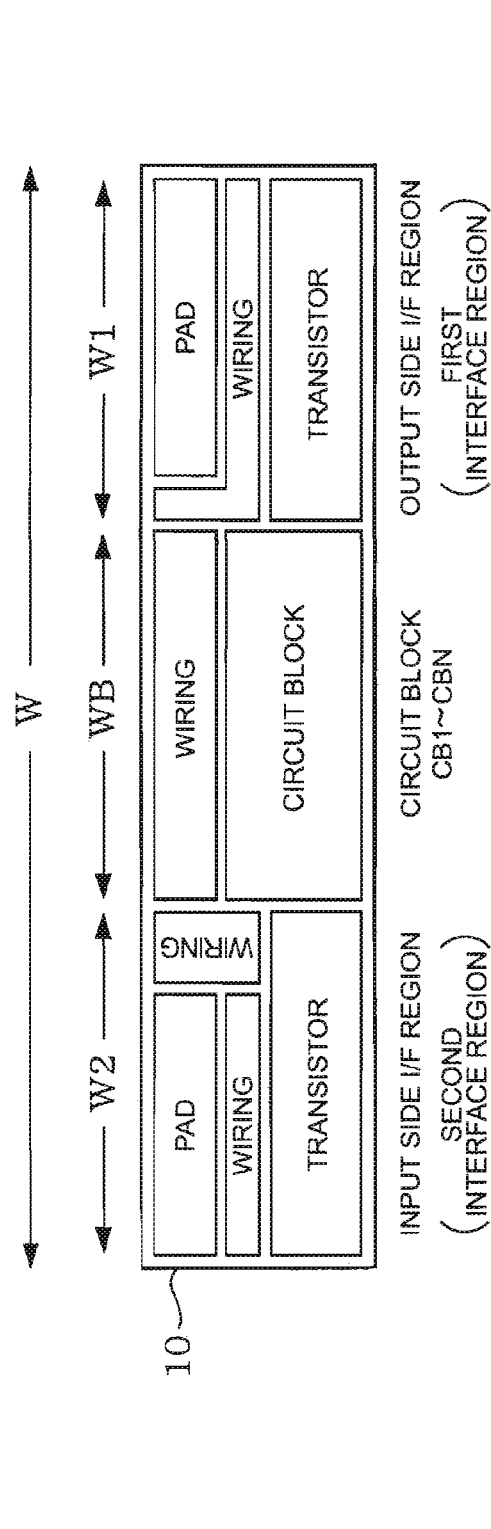
FIG. 4A is a view showing an example of the cross sectional view of the integrated circuit device.

FIG. 4A shows an example of the cross sectional view of the integrated circuit device 10 according to this embodiment along the D2 direction. In this case, W1, WB and W2 respectively denote the width of the output side I/F region 12, the width of the circuit blocks CB1~CBN, and the width of the input side I/F region 14 in the D2 direction. Further, W denotes the width of the integrated circuit device 10 in the D2 direction.

In this embodiment, as shown in FIG. 4A, it is also possible to provide no other circuit blocks interposed between the circuit blocks CB1 CBN and the output side I/F region 12 or between the circuit blocks CB1~CBN and the input side I/F region 14. Therefore, it is possible to establish the following formula: $W1+WB+W2 \leq W < W1+2 \times WB+W2$, thereby realizing an elongated integrated circuit device. To be more specific, the width W in the D2 direction can be made such that W is not more than 2 mm, more specifically, W is not more than 1.5 mm. Considering the test of chip or mounting, it is desirable that W be not less than 0.9 mm. Further, the length LD in the longer side direction can be not less than 15 mm and not more than 27 mm. Further, the chip configuration ratio SP, that is ratio of LD/W, can be not less than 10, more specifically, not less than 12.

Further, it is possible to make the widths of the respective circuit blocks CB1~CBN in the D2 direction, for example, to be the same. In this case, it is sufficient that the widths of the respective circuit blocks are substantially the same. The difference of several μm~20 μm (several tens of μm) in widths is allowable. Further, when there are circuit blocks having different widths among the circuit blocks CB1~CBN, the width WB can be the maximum width among the widths of the circuit blocks CB1~CBN.

Figure 4B:
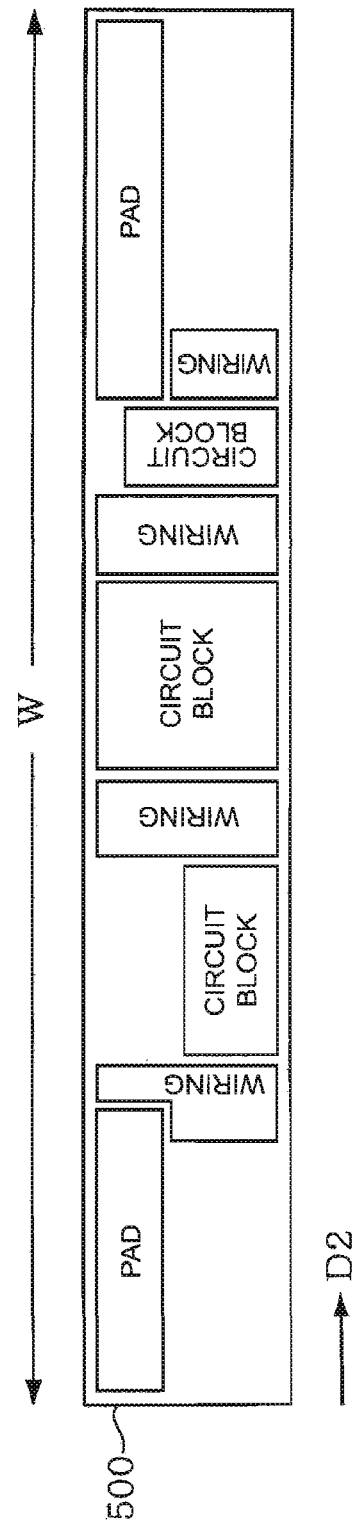
FIG. 4B is a view showing an example of the cross sectional view of the integrated circuit device.

In FIG. 4B, there is shown a comparative example in which two ore more circuit blocks are arranged along the D2 direction. Further, in the D2 direction, there are formed wiring regions between the circuit blocks or between the circuit blocks and the I/F region. Therefore, the width W in the D2 direction (shorter side direction) of the integrated circuit device 500 becomes large, thereby making it impossible to realizing a slim elongated chip. Therefore, even if the chip is subjected to shrink, the length LD in the D1 direction (longer side direction) also becomes larger, thereby making the output pitch narrower, so mounting the circuit blocks becomes rather difficult.

On the other hand, in this embodiment, as shown in FIG. 1, there are arranged a plurality of circuit blocks CB1~CBN in the D1 direction. Further, as shown in FIG. 4A, it is possible to arrange the transistor (circuit element) under the pad (bump), which means the active bump. Further, because of a global wiring formed above a local wiring which is the wiring inside the circuit bocks (below the pad), it is possible to form signal lines, for example, between the circuit blocks or between the circuit blocks and the I/F regions. Therefore, it is possible to make the width in the D2 direction narrower with the length LD in the D1 direction of the integrated circuit device 10 being maintained, thereby making it possible to realizing the slim elongated chip. As a result, it is possible to maintain the output pitch, for example, 22 μm or more, thereby making it possible to make the mounting easier.

Further, in this embodiment, the circuit blocks CB1~CBN are arranged in the D1 direction. Therefore, it is possible to easily accommodate the modification in the product specification or the like. In other words, the common platform can be used to design products of various specifications, thereby making it possible to enhance the efficiency in design. For example, even if the number of pixels or the number of gradations are increased or decreased in the example shown in FIGS. 3A and 3B, it is possible to cope with this only by increasing or decreasing the number of the blocks of the memory blocks or the number of the blocks of the data driver blocks or the like, or by increasing or decreasing the number of the read out of image data during one horizontal scanning period. Further, FIGS. 3A and 3B show the example of the display driver for an amorphous TFT panel with memory embedded. When products for a low-temperature poly-silicon TFT panel with memory embedded is to be developed therefrom, only the scanning driver block has to be removed from the circuit blocks CB1~CBN. Further, when the products without memory embedded is to be developed, only the memory block has to be removed. Furthermore, even if the circuit blocks are thus removed depending on the respective specifications, this removal has only minimum influence on the other circuit blocks in this embodiment, thereby making it possible to enhance the efficiency in design.

Further, in this embodiment, the width (height) in the D2 direction of the respective circuit blocks CB1~CBN can be uniformly the same as the width (height) of for example, the data driver block or the memory block. Further, the number of the transistors in the respective circuit blocks increases or decreases, it is possible to make adjustment by increasing or decreasing the length in the D1 direction of the respective circuit blocks, thereby making it possible to further enhance the efficiency in design. For example, in FIGS. 3A and 3B, even when the configuration of the gradation voltage generating circuit blocks or that of the power supply circuit blocks, and further the number of transistors increases or decreases, it is possible to cope with this by increasing or decreasing the length in the D1 direction of the gradation voltage generating circuit blocks or the power supply circuit blocks.

2. Data of Programmable ROM 2.1. Gradation Voltage Data

In the integrated circuit device according to this embodiment, the data stored in the programmable ROM 20 may be adjustment data for adjusting the gradation voltage. Further, the gradation voltage generating circuit (y correction circuit) generates the gradation voltage on the basis of the adjustment data stored in the programmable ROM 20. Hereinafter, the operation of the gradation voltage generating circuit (y correction circuit) GB will be described.

Figure 5:
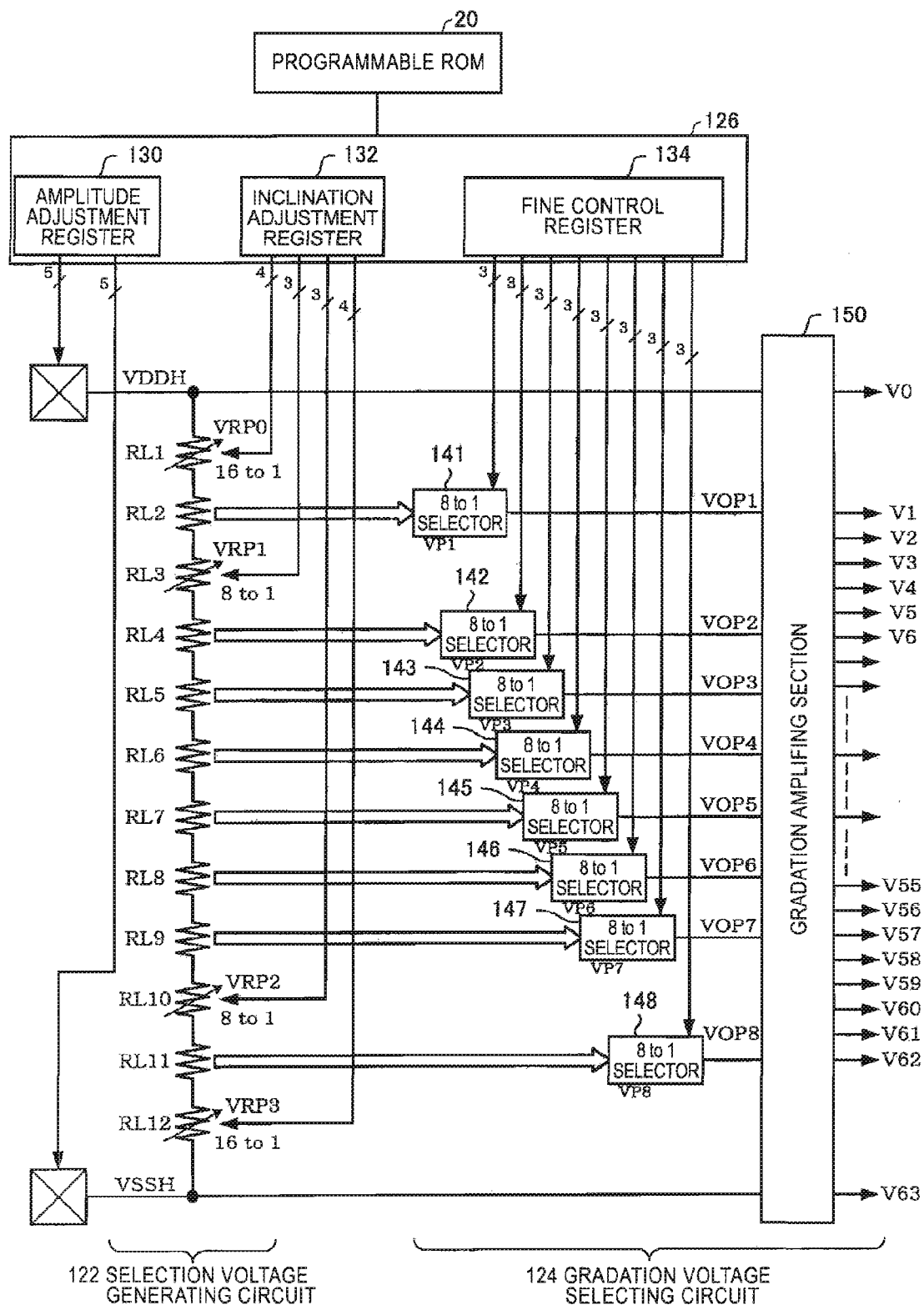
FIG. 5 is a bloc diagram showing the relation between, of the circuit blocks of FIG. 3, the programmable ROM, the logic circuit, and the gradation voltage generating circuit.

FIG. 5 shows, Of the circuit blocks shown in FIG. 3A, the programmable 20, the logic circuit and the gradation voltage generating circuit (y correction circuit) GB.

The adjustment data for adjusting the gradation voltage is inputted to the programmable ROM 20 by, for example, user (display device manufacturer). The adjustment register 126 is provided in the logic circuit LB. The adjustment register 126 can set various setting data capable of adjusting the gradation voltage. The adjustment data stored in the programmable ROM 20 is read out to the adjustment register 126, thereby inputting the setting data. The setting data read from the adjustment register 126 is supplied to the gradation voltage generating circuit GB.

The gradation voltage generating circuit GB includes the selection voltage generating circuit 122 and the gradation voltage selecting circuit 124. The selection voltage generating circuit 122 (voltage dividing circuit) outputs the selection voltage on the basis of the power supply voltage VDDH and VSSH of high voltage generated in the power supply circuit PB. To be more specific, the selection voltage generating circuit 122 includes ladder resistance circuit having a plurality of resistance elements series-connected. Further, VDDH and VSSH, i.e. the voltage divided by this ladder resistance circuit, is outputted as the selection circuit. The gradation voltage selecting circuit 124 outputs, of the selection voltages, 64 voltages in the case of the 64 gradations for example, as the gradation voltages V0~V63 on the basis of the setting data of the gradation properties supplied by the adjustment resistor 126. When doing so, it is possible to generate the gradation voltage of the optimal gradation properties (y correction properties) depending on the respective display panel.

The adjustment register 126 may include an amplitude adjustment register 130, an inclination adjustment register 132, and a fine control register 134. For the amplitude adjustment register 130, the inclination adjustment register 132, and the fine control register 134, there are set the data of the gradation properties.

For example, when the setting data of 5 bits stored in the programmable ROM 20 is read out to the amplitude adjustment register 130, the voltage level of the power supply voltage VDDH and VSSH changes as indicated by B1 and B2 of the FIG. 6A, thereby making it possible to perform the amplitude adjustment of the gradation voltage.

Further, when the setting data stored in the programmable ROM 20 is read out to the inclination adjustment register 132, the gradation voltage at 4 points of the gradation level changes as indicated by B3~B6 of FIG. 6B, thereby making it possible to perform inclination adjustment of the gradation properties. That is, on the basis of each of the setting data VRP0~VRP3 of 4 bits set in the adjustment register 132, there change the resistance values of the resistance elements RL1, RL3, RL10 and RL12 constituting the ladder resistance, thereby making it possible to perform the inclination adjustment as indicated by B3.

Further, when the setting data stored in the programmable ROM 20 is read out to the fine control register 134, the gradation voltage at 8 points of the gradation level changes, thereby making it possible to perform fine control of the gradation properties. In other words, on the basis of each of the setting data VP1~VP8 of 3 bits set to the fine control register 134, 8 to 1 selector 141~148 each select one tap of respective 8 taps of 8 resistance elements RL2, RL4~RL9, RL11 to thereby output the voltages of selected tap as VOP1~VOP8. As a result, it is possible to perform the fine control as indicated by B7~B14 of FIG. 6C.

The gradation amplifier portion 150 outputs the gradation voltages V0~V63 on the basis of the output VOP1~VOP8 of the 8 to 1 selector 142~148 or VDDH and VSSH. To be more specific, the gradation amplifier portion 150 includes a first to an eighth impedance conversion circuits (operating amplifier connected to a voltage follower) to which VOP1~VOP8 are input. Further, the gradation voltages V1~V62 are generated by performing the resistance division for the output voltage of the impedance conversion circuits adjacent to each other among from the first to eighth impedance conversion circuits.

When the above-mentioned adjustment has been performed, it is possible to obtain the optimal gradation properties (y properties) which correspond to the types of the display panels, thereby making it possible to enhance the display quality. Further, in this embodiment, the adjustment data for obtaining the optimal gradation properties (y properties) which correspond to the types of the display panel is stores in the programmable ROM 20. Therefore, it is possible to obtain the optimal gradation properties (y properties) for each type of the display panels, thereby making it possible to enhance the display quality.

Further, in this embodiment, the programmable ROM 20 and the logic block LB are arranged in the first direction D1 so as to adjacent to each other. With this arrangement, it is possible to connect the signal lines for the adjustment data from the programmable ROM 20 to the logic circuit block LB through the short path, thereby making it possible to prevent the increase in chip area due to the wiring region.

Furthermore, in this embodiment, as shown in FIG. 3A, the logic circuit block LB and the gradation voltage generating circuit block GB may be arranged in the D1 direction so as to be adjacent to each other. With this arrangement, it is possible to connect the signal lines from the logic circuit block LB to the gradation voltage generation circuit block GB through the short path, thereby making it possible to prevent the increase in chip area due to the wiring region.

2.2 Panel Setting Voltage Data

In the integrated circuit device according to this embodiment, the data stored in the programmable ROM 20 may be the adjustment data for adjusting the panel voltage. The adjustment data for adjusting the panel voltage may be, for example, the data for adjusting the voltage which supplied to the opposite electrode VCOM.

Figure 7:
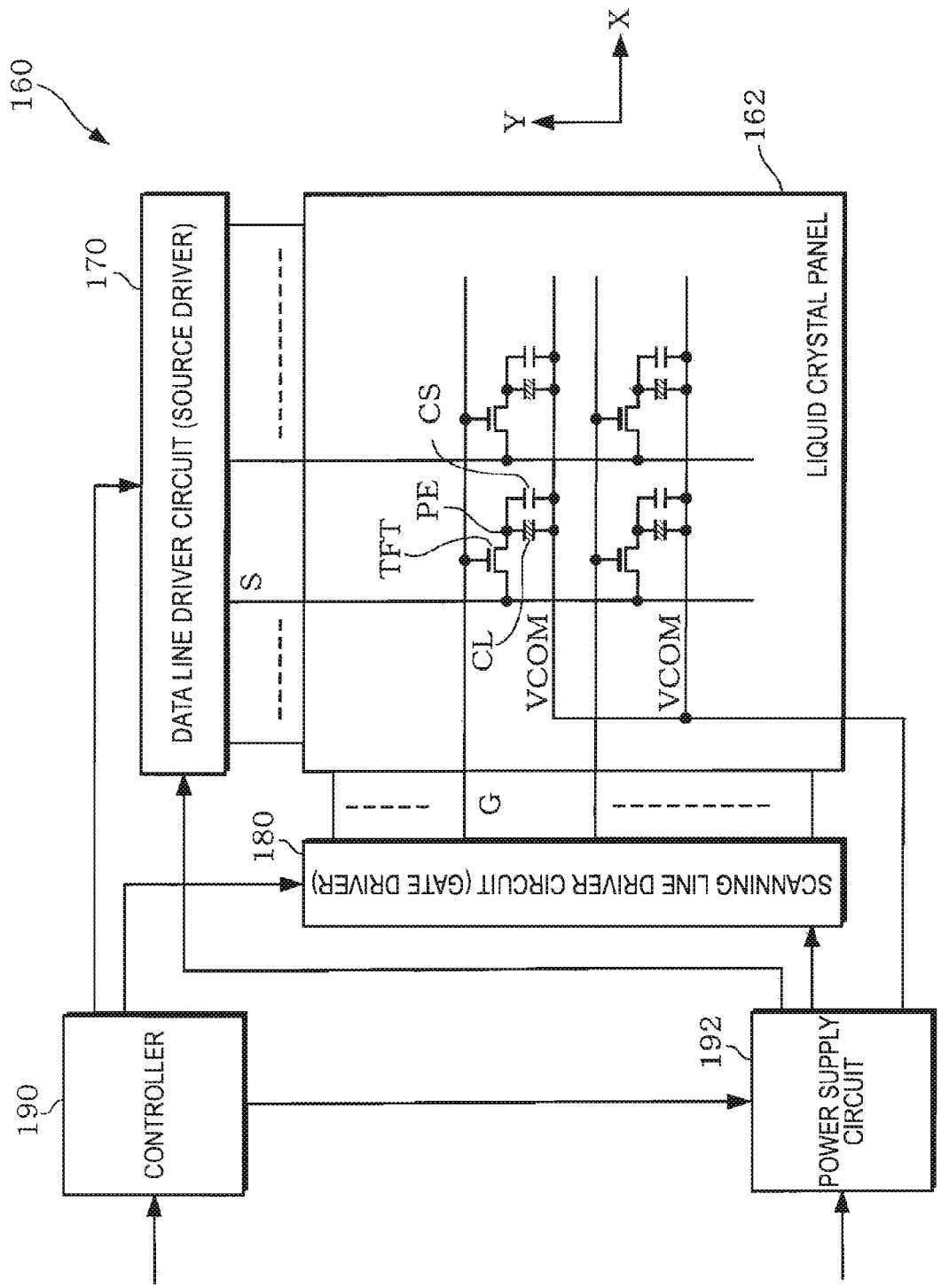
FIG. 7 is a block diagram showing a construction example of the display device including an electro-optical device.

FIG. 7 shows a block diagram showing a construction example of the display device including the electro-optical device. The display device of FIG. 7 realizes the functions as the liquid crystal device. Further, the electro-optical device realizes the functions as the liquid crystal panel.

The liquid crystal device 160 (which is broadly interpreted to be as the display device) includes the liquid crystal panel (which is broadly interpreted to be as the display panel) 162 using the TFT as a switching element, a data line driver circuit 170, a scanning line driver circuit 180, a controller 190, and the power supply circuit 192.

The gate electrode of the TFT is connected to a scanning line G, the source electrode of the TFT is connected to a data line S, and the drain electrode of the TFT is connected to a pixel electrode PE. Between the pixel electrode PE and the opposite electrode VCOM (common electrode) opposed to a liquid crystal element (which is broadly interpreted to be an electro-optical substance), there are formed a liquid crystal capacitance (liquid crystal element) and an auxiliary capacitance CS. Further, a liquid crystal material is filled between an active matrix substrate on which the TFT, the pixel electrode PE an the like are formed and the opposite substrate on which the opposite electrode VCOM is formed, thereby making it possible to allow the transmittance of the pixel to change depending on the voltage applied between the pixel electrode PE and the opposite electrode VCOM.

In this embodiment, the adjustment data for adjusting the voltage supplied to the opposite electrode VCOM may be stored in the programmable ROM 20. Further, on the basis of the adjustment data, the voltage of the power supply circuit 192 is adjusted to be supplied to the opposite electrode VCOM. The adjustment data is set for each of the display panel, thereby making it possible to enhance the display quality.

In this embodiment, as shown in FIG. 3A, the programmable ROM 20 and the power supply circuit block PB are arranged in the first direction D1 so as to be adjacent to each other. With this arrangement, it is possible to connect the signal lines of the adjustment data from the programmable ROM 20 to the power supply circuit block PB through the short path, thereby making it possible to prevent the increase in chip area due to the wiring region.

2.3. Other User Setting Information

In the integrated circuit device according to this embodiment, the data stored in the programmable ROM 20 is not limited to those above described. For example, it is possible to store the adjustment data for adjusting a predetermined timing as the display driver adjustment data in the programmable ROM 20. In other words, on the basis of the adjustment data, various control signals, which control the refresh period, the display timing or the like. Alternatively, the adjustment data for adjusting the startup sequence configuration of the integrated circuit device may be stored in the programmable ROM 20 as the display driver adjustment data.

The above-mentioned data are programmed by a user. However, IC manufacturer may be store those data which is adjusted during the IC manufacturing and test processes.

3. Programmable ROM 3.1. Total Configuration of Programmable ROM

Figure 8:
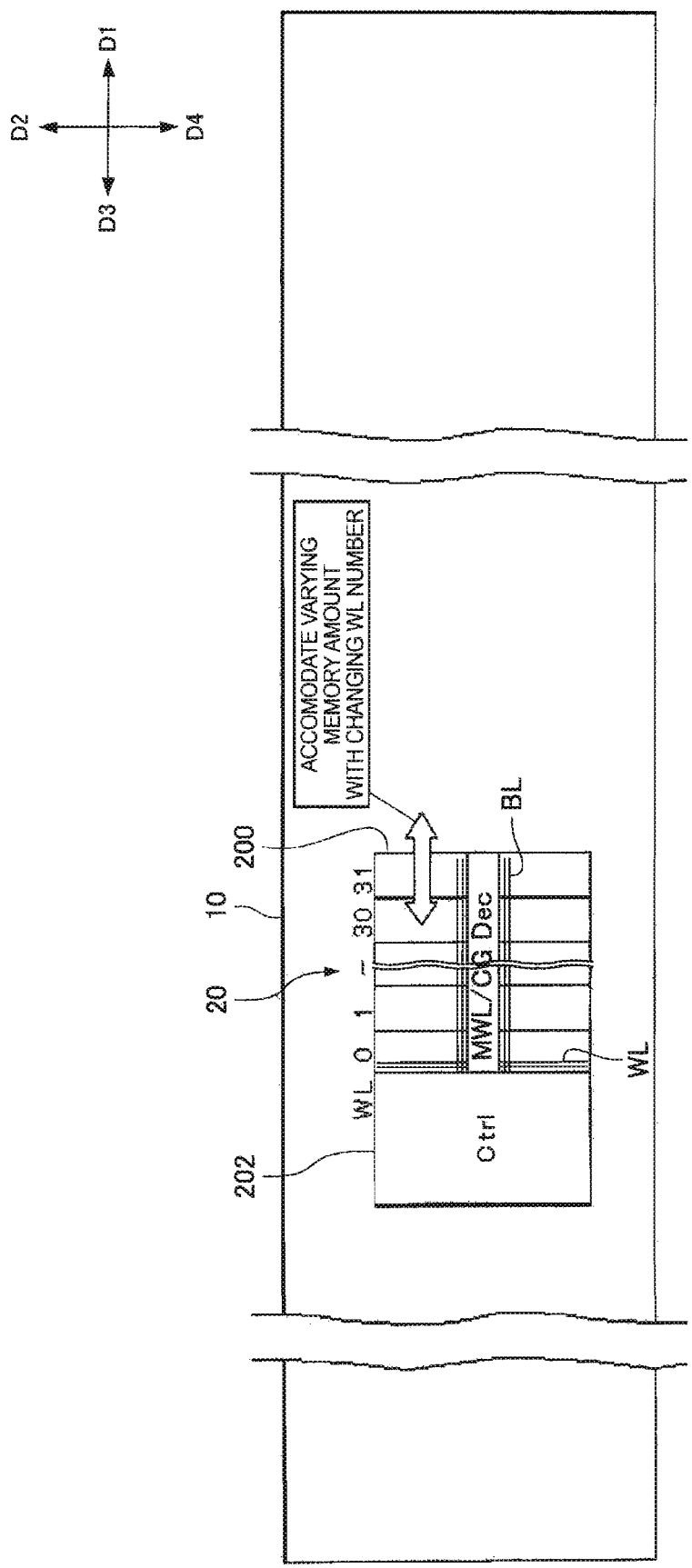
FIG. 8 is a view showing the layout of the programmable ROM block in the integrated circuit device.

FIG. 8 show the programmable ROM 20 arranged in the integrated circuit device 10. The programmable ROM 20 is broadly divided into a memory cell array block 200 and a control circuit block 202. The memory cell array block 200 and the control circuit block 202 are adjacent to each other in the D1 direction, which is the longer side direction of the integrated circuit device 20.

In the memory cell array block 200, there are provided a plurality of word lines WL and a plurality of bit lines BL. The plurality of word lines WL extend in the D2 direction which is the shorter side direction of the integrated circuit device 10. The plurality of bit lines BL extend in the D1 direction, which is the longer side direction of the integrated circuit device 10. The reason for this arrangement will be described below.

The memory capacity of the programmable ROM 20 may be increased or decreased for each of the models depending on the specification at the user side. In this embodiment, the increase or decrease of the memory capacity can be coped with by modifying the number of the word lines WL. In other words, the length of the word lines WL is consistent even if the memory capacity changes. As a result, the number of memory cell that is connected to one word line WL becomes fixed. When the number of the word lines WL is increased, the memory capacity of the programmable ROM 20 is increased. Even if the memory capacity of the programmable ROM 20 is increased, the memory cell array block 200 does not become long in the shorter side direction (D2 direction) of the integrated circuit device 10. Thus, it is possible to maintain the slim configuration described with reference to FIG. 1.

Figure 9:
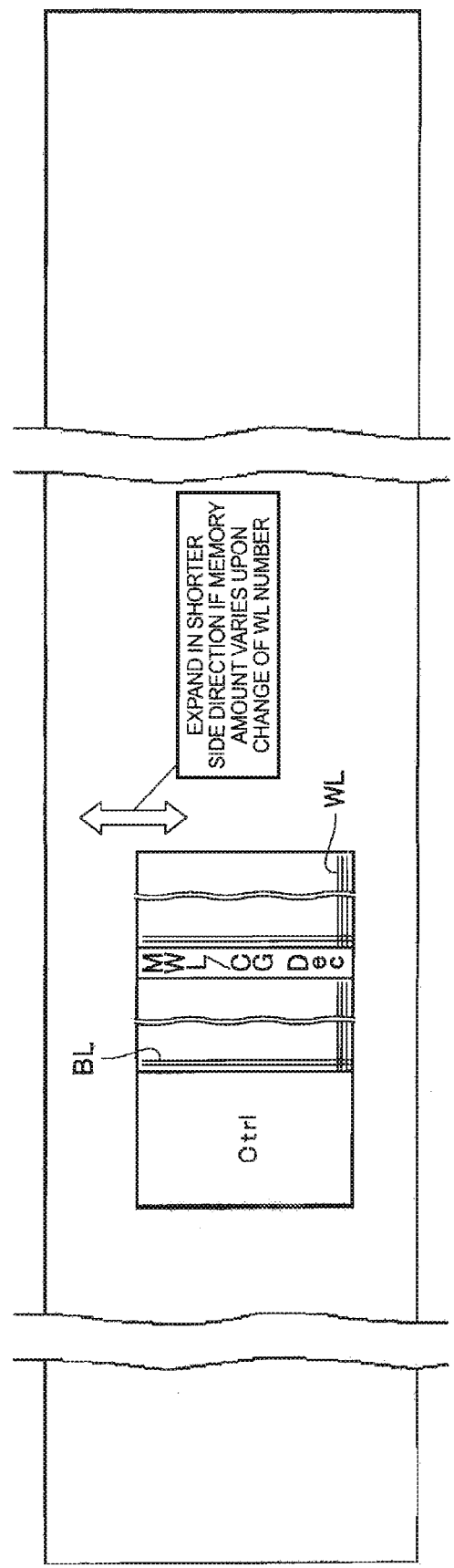
FIG. 9 is a view showing the layout of the comparative example for the construction of FIG. 8.

Another reason is described below. Even if the memory capacity of the programmable ROM 20 is increased or decreased, the control circuit block 202 does not become longer in the shorter side direction (D2 direction) of the integrated circuit device 10. Thus, it is possible to maintain the slim configuration described with reference to FIG. 1. In the comparative example shown in FIG. 9, the memory capacity of the programmable ROM 20 is increased. As a result, the memory cell array block 200 becomes longer in the shorter side direction (D2 direction) of the integrated circuit device 10. In this case, the circuit design of the control circuit block 202 must be revised. However, this measure does not have to be taken according to the layout of this embodiment shown in FIG. 8, which is obtained by turning the comparative example of FIG. 9, by 90°. Therefore, even if the memory capacity of the programmable ROM 20 is increased or decreased, it is possible to enhance, in particular, the design efficiency of the control circuit block 202.

A further example will be described below. The bit lines BL extend in the D1 direction, which is the longer side direction of the integrated circuit device 10. On the direct extension of those bit lines BL, there can be arranged the control circuit block 202. One function of the control circuit block 202 is to detect, by the sense amplifier, the data read via the bit lines BL and to supply them to other circuit blocks. With the layout described above, it is possible to supply the data read from the memory cell array block 200 to the control circuit block 202 thorough the shorter path as compared to the comparative example of FIG. 9.

3.2. Memory Cell of Single Layer Gate

Figure 10:
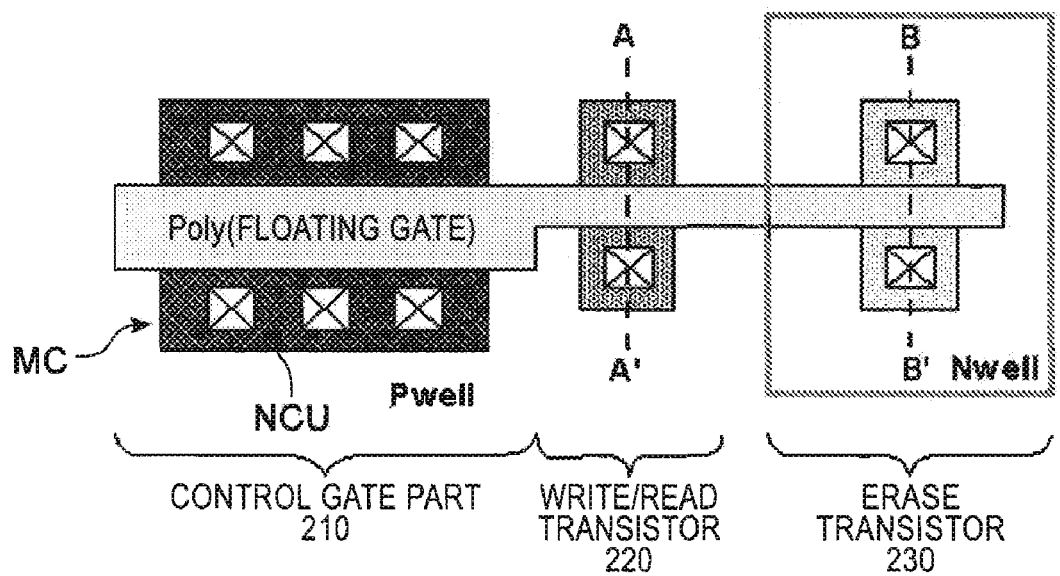
FIG. 10 is a plane view of a memory cell of a single layer gate arranged in the programmable ROM.
Figure 11:
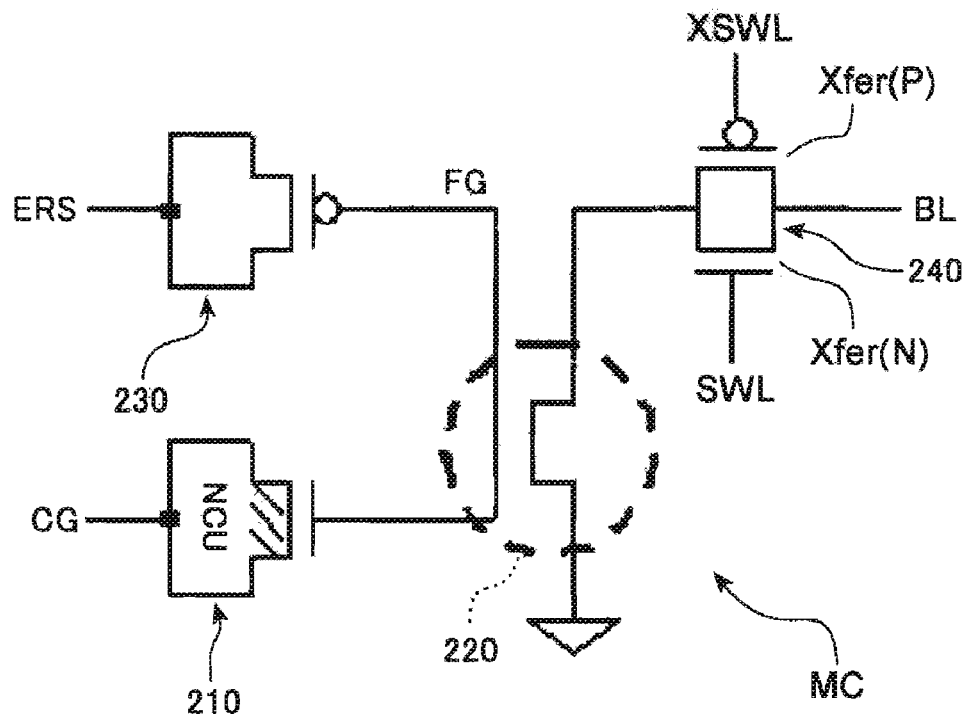
FIG. 11 is a view showing an analogous circuit of the memory cell shown in FIG. 10.

FIG. 10 shows a plan view of a memory cell MC of single layer gate arranged in the memory cell array block 00 shown in FIG. 8. FIG. 11 shows a view showing an analogous circuit of the memory cell MC of single layer gate.

As shown in FIG. 10, the memory cell MC includes a control gate part 210, a write/read transistor 220, and an erase transistor 230. A floating gate FG formed by poly-silicon extends to the above three regions. As shown in FIG. 11, the memory cell MC includes a transfer gate 240 provided between a drain of the write/read transistor 220 and the bit lines BL. The transfer gate 240 performs connection/disconnection of the drain of the write/read transistor 220 and the bit lines BL by the state of the sub word lines SWL and the state of the inverted sub word lines XSWL. The transfer gate 240 is configured by a P type MOS transistor Xfer (P) and an N type MOS transistor Xfer (N). When the word lines have no hierarchical structure, the transfer gate 240 is controlled by the respective states of the word lines and the inverted word lines.

The single layer gate means that only one layer of the floating gate FG of poly-silicon is formed because the control gate CG is formed by an N type (which is broadly interpreted to be a second conductive type) impurity layer NCU formed in the P type well PWEL of the semiconductor substrate (for example, P type; broadly interpreted to be the first conductive type). In other words, the single layer gate means that two layers of the control gate CG and the floating gate FG are not formed by poly-silicon. A coupling capacity is formed by the control gate CG and the floating gate FG opposed thereto.

In the embodiment of the present invention, there is provided the "single layer gate" structure having only the floating gate. However, the present invention differs from the conventional techniques in that the write and the erase are performed by the MOS transistors having different channel conductivities. Performing the write and the erase by the different MOS transistors provides the following advantages. The erase is performed as follows. The voltage is applied to the portions where the capacity coupling is small, while the portions where the capacity coupling is large is made to have 0V, thereby pulling out the electrons filled in the floating gate by FN tunnel current. Examples of the nonvolatile storage of single gate type of the conventional techniques include one, which performs the write and the read by the same MOS transistor (at the same portion). In the nonvolatile storage of the single gate type, it is necessary to enlarge the capacity between the control gate and the floating gate electrode depending on the capacity of the write region. Therefore, the capacity of the write region is made to be smaller. As a result, when erasing, it is necessary to apply lager voltage to the portions where the coupling capacity is small.

However, particularly in a fine nonvolatile storage, it is impossible to keep the sufficient breakdown voltage against the voltage applied upon erasing. Therefore, there is a fear in that the MOS transistor may be destroyed. In view of this, in the programmable ROM block according to this embodiment, the read and the erase are performed by the different MOS transistors and the channel conductivities of the respective MOS transistors are different. When, as the MOS transistor performing the erase, a P channel type MOS transistor is formed, for example, this MOS transistor for performing the erase is formed on the N type well. Therefore, upon erasing, it is possible to apply the voltage up to the junction breakdown voltage of the N type well and the substrate (semiconductor layer). As a result, as compared to the case where the erase is performed in the same area where the write is performed, it is possible to increase the breakdown voltage against the voltage upon erasing, thereby making it possible to realize miniaturization and to enhance reliability.

In the integrated circuit device 10 according to this embodiment, there are Low Voltage (LV) type components (for example, 3V), Middle Voltage (MV) type components (for example, 6V), and High Voltage (HV) type components (for example, 20V). The memory cell MC is breakdown voltage structure of MV type. The write/read transistor 220 and the N type MOS transistor Xfer (N) are both MV type N type transistors. The erase transistor 230 and the P type MOS transistor Xfer (P) are both MV type P type transistors.

Figure 12:
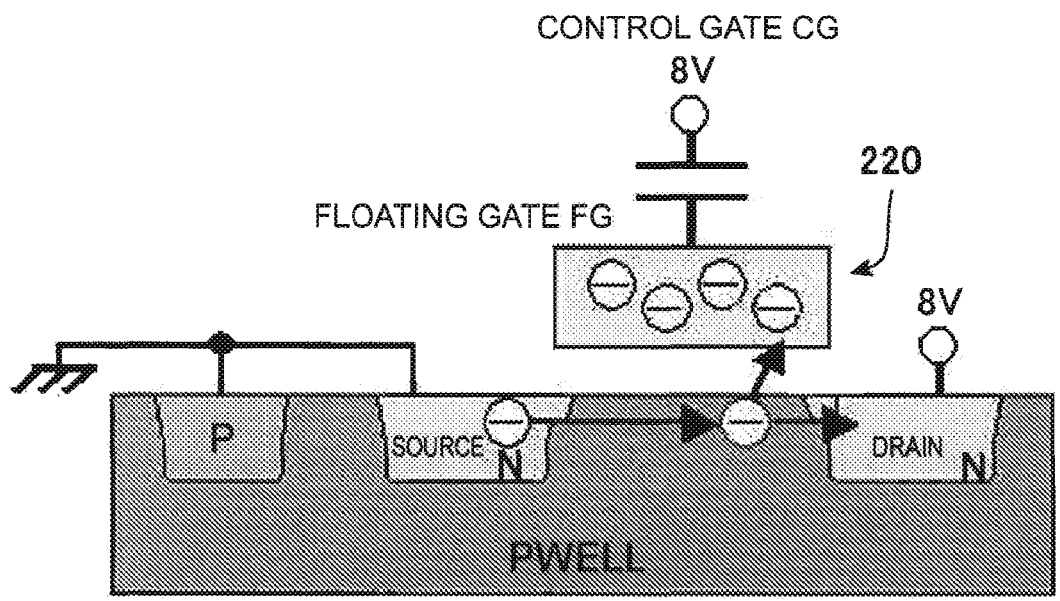
FIG. 12 is a cross sectional view taken along the line A-A' of FIG. 10 and showing the principle of the programming (writing) in the memory cell.
Figure 13:
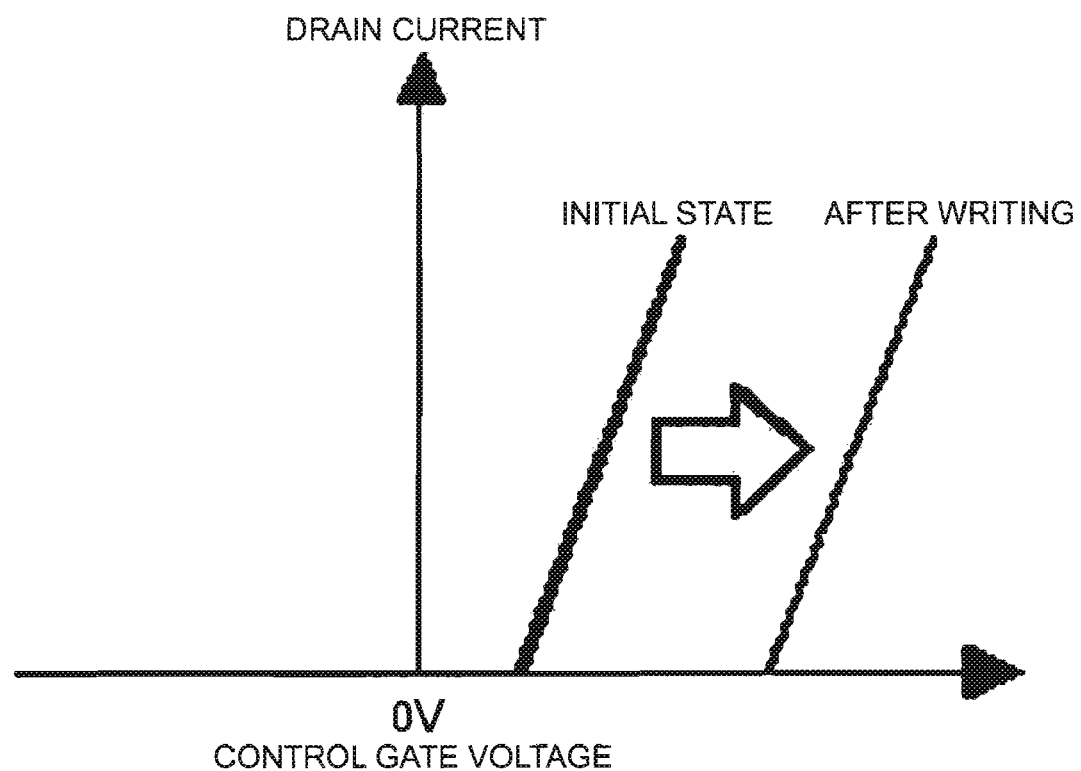
FIG. 13 is a view illustrating how the threshold value of the write/read transistor varies after the programming.

FIG. 12 shows a chart illustrating a data write (program) operation to the memory cell MC. 8V is applied, for example, to the control gate CG, and 8V, for example, is applied to the drain of the write transistor 220 via the bit lines BL and the transfer gate 240. The potential of the source of the write/read transistor 220 and the P type well PWEL is 0V. As a result, hot electrons are generated in the channel of the write/read transistor 220, and the electrons are pulled into the floating gate of the write/read transistor 220. As a result, the threshold value Vth of the write/read transistor 220 becomes higher than in the initial state as shown in FIG. 13.

Figure 14:
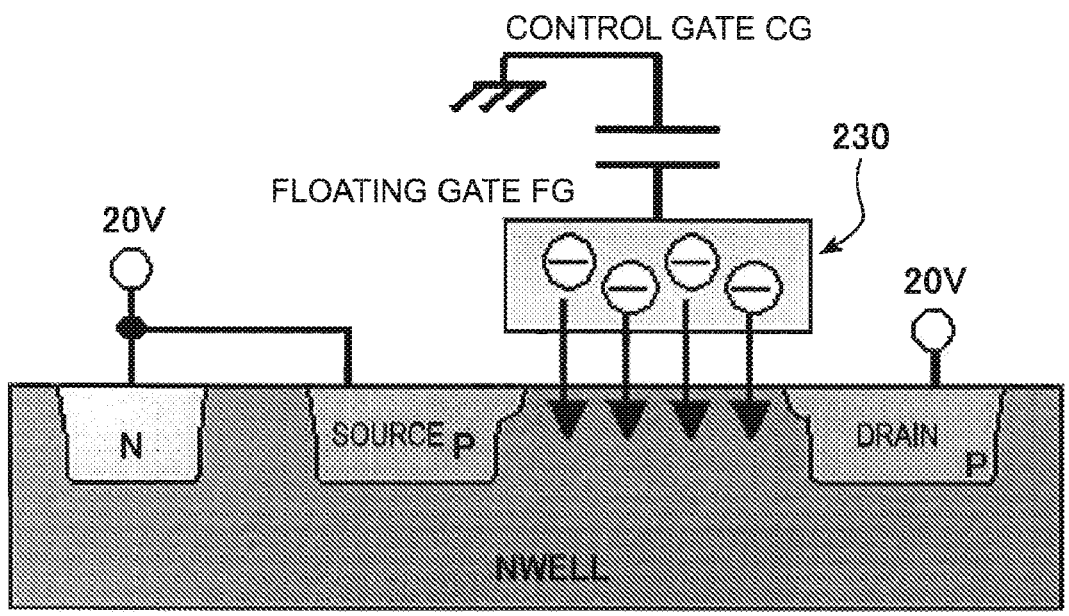
FIG. 14 is a cross sectional view taken along the line B-B' of FIG. 10 and showing the principle of the erasing in the memory cell.
Figure 15:
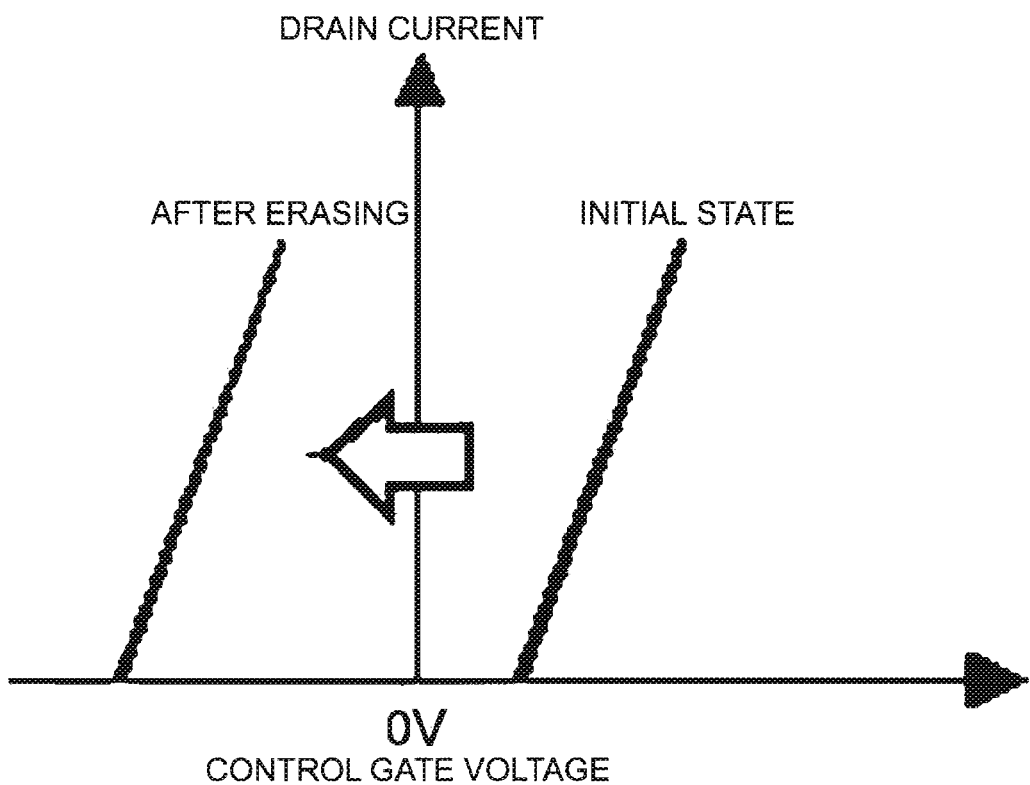
FIG. 15 is a view illustrating how the threshold value of the write/read transistor varies after the erasing.

On the other hand, when erasing, as shown in FIG. 14, 20 V is applied to the drain of the erase transistor 230, and the control gate CG is grounded. The potential of the source of the erase transistor 230 and the N type well NWEL is, for example, 20V. As a result, there is applied a high voltage between the control gate CG and the N type well NWEL, so the electrons of the floating gate FG are pulled into the N type well NWEL side. With this Fowler-Nordheim (EN) tunnel current, the data is erased. At this time, the threshold value Vth of the write/read transistor 220 is a negative threshold value, which is smaller than in the initial state as shown in FIG. 15.

Figure 16:
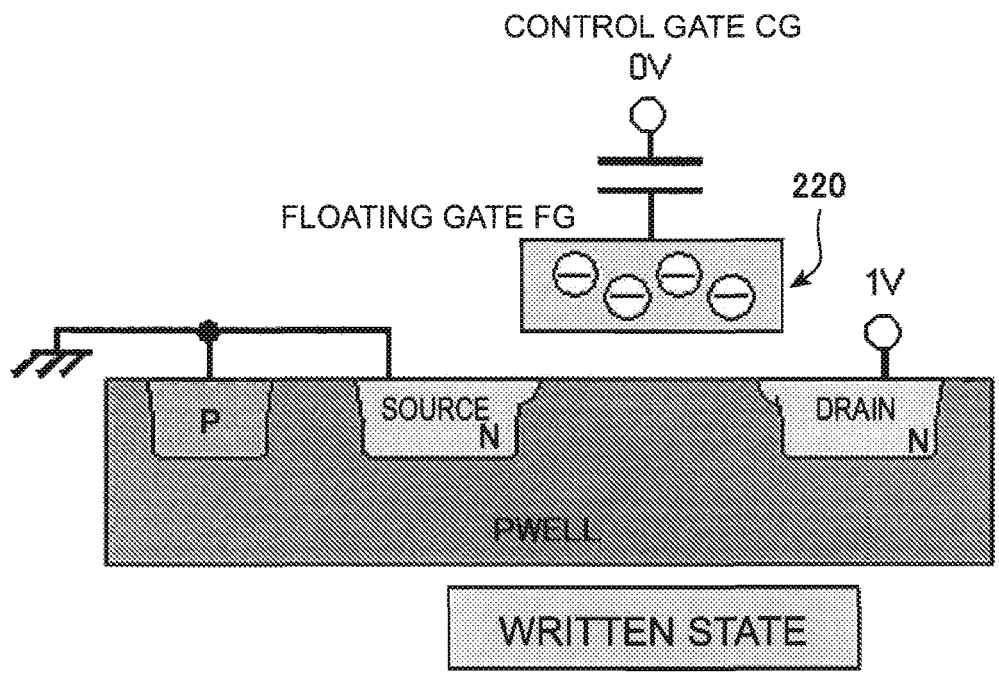
FIG. 16 is a cross sectional view taken along the A-A' line of FIG. 10 and showing the principle of the reading of the data from the memory cell in the written state.
Figure 17:
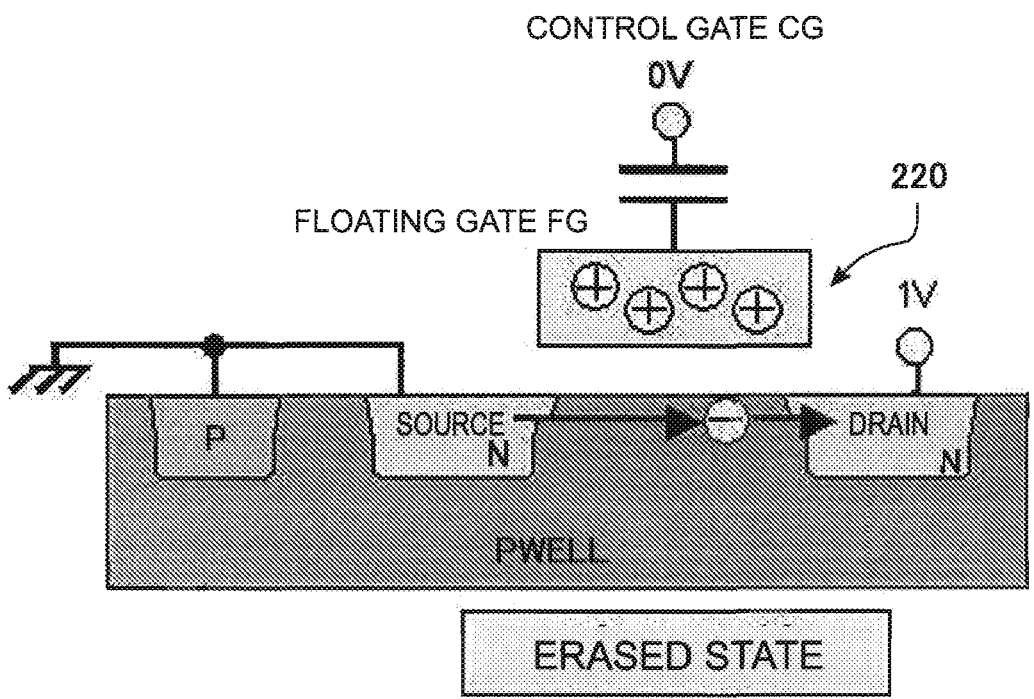
FIG. 17 is a cross sectional view taken along the A-A' line of FIG. 10 and showing the principle of the reading of the data from the memory cell in the erased state.

Upon reading the data, as shown in FIGS. 16 and 17, the control gate CG is grounded, and 1V, for example, is applied to the drain of the write/read transistor 220. At this time, the potential of the source of the write/read transistor 220 and the P type well PWEL is 0V. In the written state shown in FIG. 16, the floating gate FG is in a state where excess electrons exist, so no current flows into the cannel. On the other hand, in the erased state shown in FIG. 17, the floating gate FG is in a state where excess positive holes exist, so electrons flow into the channel. Depending on the presence or absence of the current, the read of the data becomes possible.

The programmable ROM 20 according to this embodiment is used as a nonvolatile memory in which mainly the user stores the adjustment data instead of the conventional E²ROM, trimmer resistance or the like, or in which the IC manufacturer stores the adjustment data during the manufacturing and test processes. Therefore, it is sufficient that the programmable ROM 20 guarantees about five-times reprogram.

3.3. Memory Cell Array Block 3.3.1. Plane Layout

Figure 18:
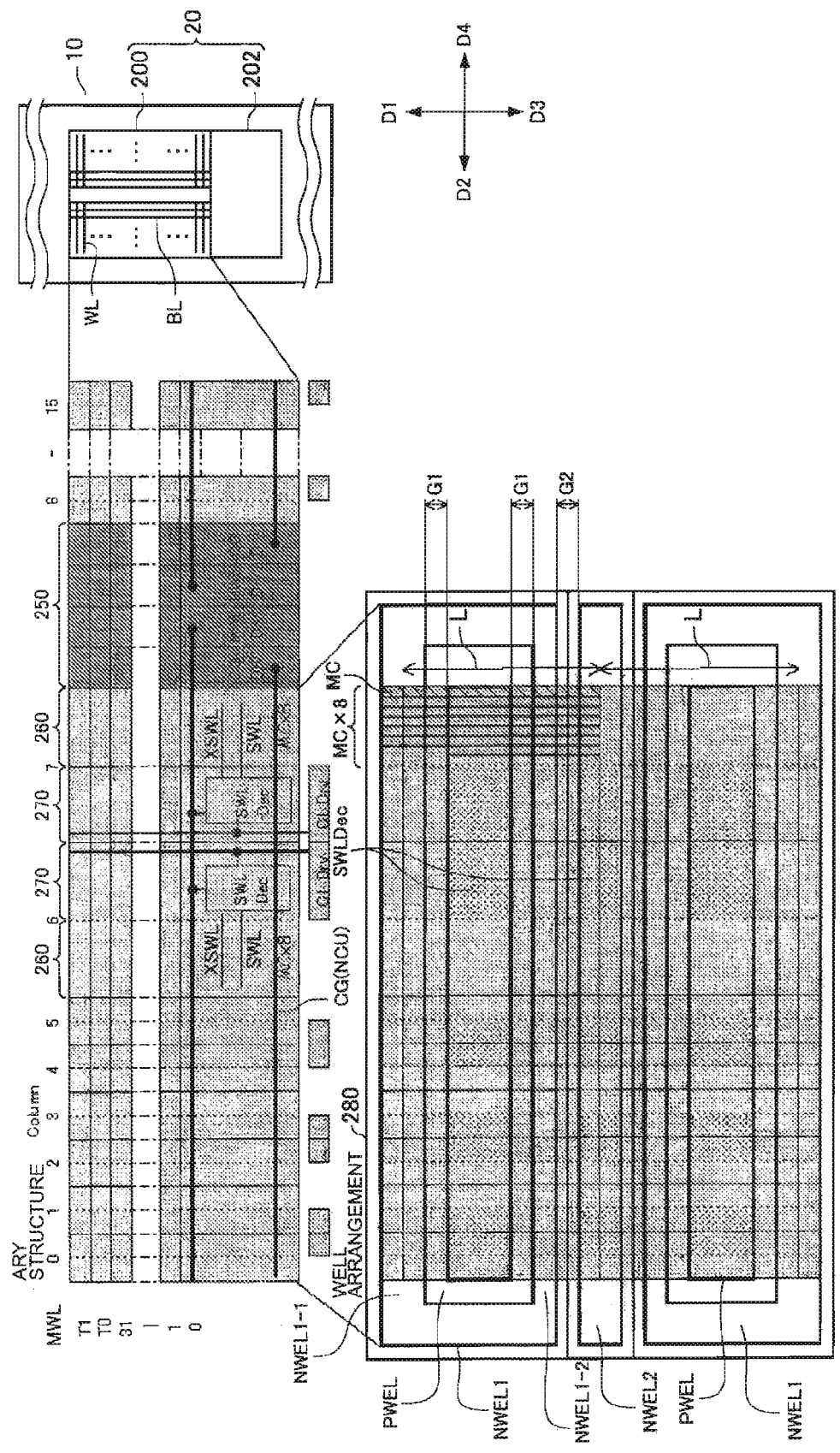
FIG. 18 is a plane view showing the memory cell array block of the programmable ROM.

FIG. 18 shows a plane view of the memory cell array block 200 with a portion thereof being enlarged. The memory cell array block 200 is provided with a formation region 250 for a main word line driver MWLDrv and a control gate line driver CGDrv at the central portion in the shorter side direction (D2 direction) of the integrated circuit device 10. This formation region 250 divides the memory cell array block 200 into a first region and a second region. In this embodiment, the first region and the second region are respectively provided with 8 column blocks, so there are provided 16 column blocks 0~15. In one column block, there are arranged 8 memory cell MC in the D2 direction. In this embodiment, the length W in the shorter side of the integrated circuit device 10 shown in FIG. 3A is 800 µm, and on the basis of the length of the one memory cell in the D2 direction. Further, as the number of the memory cells MC which fall in the range of the length W, there is established a design of 16 columns×8 memory cells. In order to increase or decrease the memory capacity of the programmable ROM 20, it is sufficient that the numbers of the word lines are increased or decreased. Further, there are provided respectively one main word line driver MUVLDrv and one control gate line driver CGDrv at each of the divided region, that is, totally two of them are provided. The respectively one main word line driver MWLDrv and the control gate line driver CGDrv may be provided at the end of the memory cell array block 200.

As shown in FIG. 18, the numbers of main word lines MWL are 34. These lines are driven by one main word line driver MWLDrv. Two of the main word lines are the main word lines T1 and T0 for a test connected to the memory cell, which is for test bits of the IC manufacturer. Further, the control gate lines CG (which correspond to the N type impurity layer NCU shown in FIG. 10), which are driven by one control gate line driver CGDrv, extend in parallel to the main word lines MWL.

Each of 16 column blocks 0~15 has a memory cell region 260 and a sub word line decoder region 270. The sub word line decoder region 270 is provided with a sub word line decoder SWLDec connected to each of the main word line MWL. Further, in the control circuit block 202, there is provided a column driver CLDrv for each of the sub word line decoder regions 270. All of the sub word line decoder SWLDec arranged in the respective sub word line decoder regions 270 is common-connected to an output line of the column driver CLDrv.

From one sub word line decoder SWLDec into the adjacent memory cell region 260, there extend the sub word line SWL and the inverted sub word line XSWL. In the memory cell region 260 in one column block, there are arranged, for example, 8 memory cells MC which is common-connected to the sub word line SWL, and the inverted sub word line XSWL.

According to the layout shown in FIG. 18, one main word line MWL is selected by the main word line driver MWLDrv and one column block is selected by the column decoder CLDrv, thereby selecting one sub word line decoder SWVL-Dec. 8 memory cells MC connected to the sub word line decoder SWLDec thus selected are selected cells and then the programming (writing) or reading of the data is performed.

3.3.2. Well Layout of Memory Cell and Sub Word Line Decoder Region

FIG. 18 shows a well layout which is common to the memory cell region 260 and the sub word line decoder region 270. In order to form one memory cell MC in the memory cell region 260, there are used 3 wells. The first of those wells is a P type well PWEL (which is broadly interpreted to be the first conductive type surface well) extending in the direction along the main word line MWL (D2 direction). The second is an annular N type well NWEL1 (which is broadly interpreted to be the second conductive type annular surface well) surrounding this P type well PWEL. The third is a strip-shaped N type well NWEL2 (which is broadly interpreted to be the second strip-shaped N type surface well) extending in the direction along the main word lines MWL at the side of the annular N type well NWEL1 (D2 direction). One longer side of the annular N type Well NWEL1 is denoted by NWEL1-1, and the other longer side (NWEL2 side) is denoted by NWEL1-2.

One memory cell is formed on three wells (PWEL, NWEL1 and NWEL2) along the length region L of one memory cell shown in FIG. 18. In the length region L in the respective memory cells 260, there are formed 8 memory cells MC that is common-connected to one sub word line decoder SWLDec.

As shown in FIG. 18, there are P type impurity rings 280 (which is broadly interpreted to be the first conductive type impurity ring) each surrounding the annular N type well NWEL1 and the stripe-shaped N type well NWEL2. The description thereof will be made later.

As shown in FIG. 18, there are formed three wells described above (PWEL, NWEL1, and NWEL2) also in the sub word line decoder region 270. The formation region for the transistor constituting the sub word line decoder SWLDec is on the P type well PWEL and the stripe-shaped N type well NWEL2 indicated by doted region of FIG. 18, and is not on the annular N type well NWEL1.

3.3.3. Plane Layout and Cross Sectional Structure of Memory Cell

Figure 19:
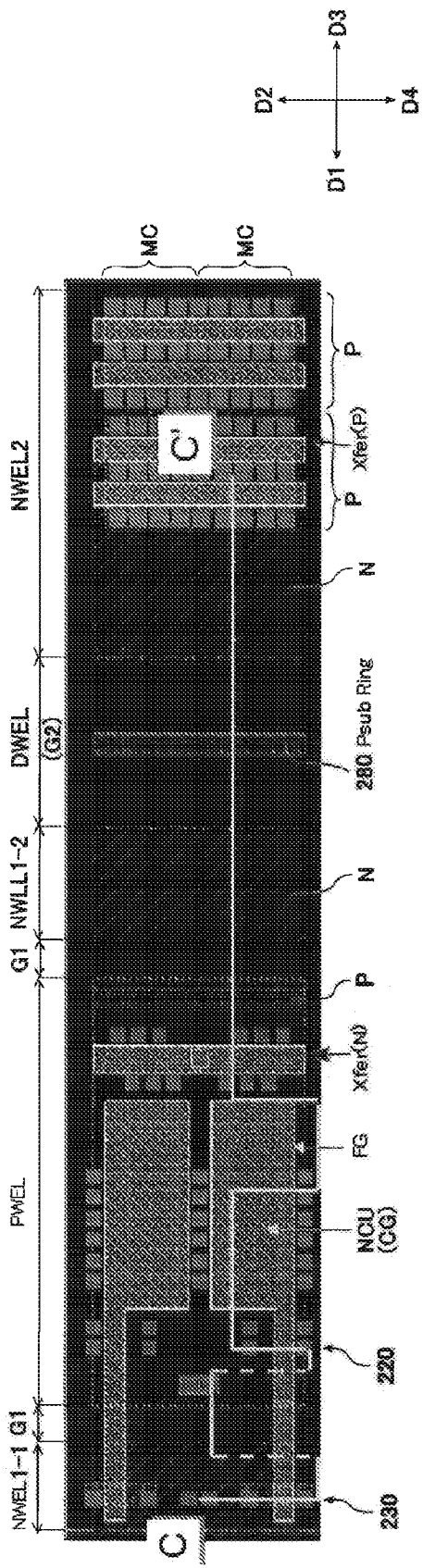
FIG. 19 is a view showing two adjacent memory cells.
Figure 20:
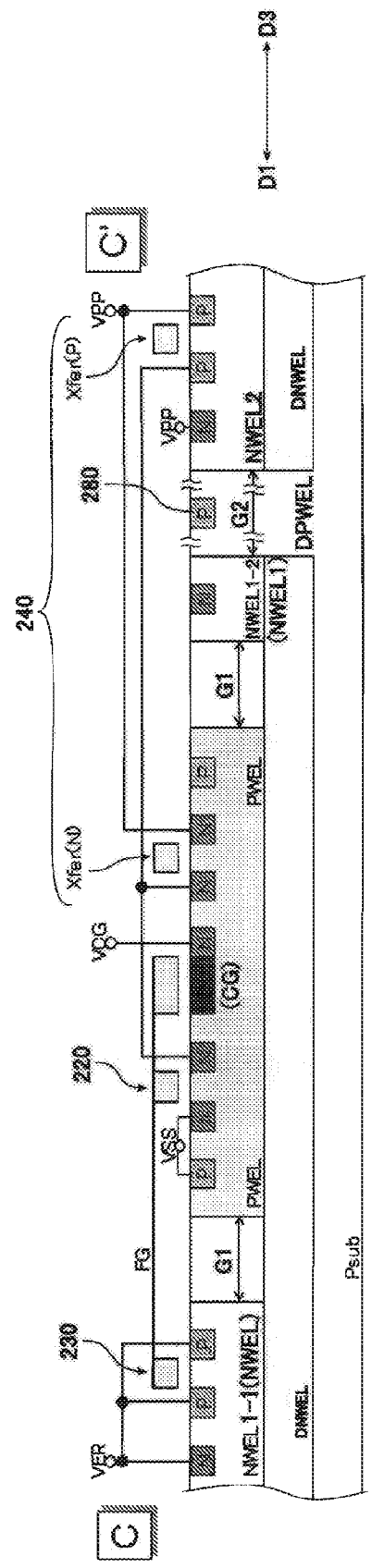
FIG. 20 is a cross sectional view taken along the line C-C' of FIG. 19.

FIG. 19 shows a plane layout of two adjacent memory cells MC shown in FIG. 18. FIG. 20 shows a cross section taken along the line C-C' of FIG. 19 and is a cross sectional view of one memory cell MC. Of the broken lines C-C' of FIG. 19, the cross section taken along the broken line in the D2 direction is not shown in FIG. 20. Further, of the broken lines C-C' of FIG. 19, the dimension thereof in the D1 direction does not necessarily correspond to the dimension in the D1 direction shown in FIG. 20.

As shown in FIG. 19, two memory cells MC are arranged in a mirror manner viewed in the plane. As shown in FIG. 19, the memory cells are formed so as to straddle over three wells (PWEL, NWEL1, and NWEL2) as described above. The lower layer inside the outer edge region of the annular N type well NWEL1 and the lower layer of the stripe-shaped n type well NWEL2 are provided with a deep layer N type well DNWEL (which is broadly interpreted to be the second conductive type deep layer well) as shown in FIG. 20. As shown in FIG. 20, inside three wells (PWEL, NWEL1, and NWEL2) on the deep layer N type well DNWEL, there is provided a P type impurity region or N type impurity region (which is broadly interpreted to be the uppermost surface layer impurity region), so the memory cell MC according to this embodiment has a triple structure. As a result, it is possible to set the potential differently for a P type substrate Psub and for a P type well PWEL. Not Only the programmable ROM 20 but also other circuit blocks are formed on the P type substrate Psub, and further there is a need for applying a back gate voltage, the potential of the P type substrate Psub is not necessarily fixed to be a ground potential.

As shown in FIGS. 19 and 20, on one longer side region NWEEL1-1 of the annular N type well NWEL 1 and the upper layer of the P type well PWEL, there is formed a floating gate FG of poly-silicon via an insulating film (not shown). This floating gate FG functions as the common gate of the write/read transistor 220 formed in PWEL and the erase transistor 230 formed in one longer side region NWEL1-1 of the annular N type well NWEL1. Further, on the P type well PWEL region opposed to the floating gate FG via the insulating film, there is formed the N type impurity region NCU. This impurity region NCU functions as the control gate CG upon applying the control gate voltage VCG thereto.

The P type well PWEL is provided with the N type MOS transistor Xfer (N) of transfer gate 240 shown in FIG. 11. The stripe-shaped N type well NWEL2 is provided with the P type MOS transistor Xfer (P) of the transfer gate 240. As shown in FIG. 19, there are provided a plurality of P type MOS transistors Xfer (P). Those are connected in parallel to thereby maintain the gate width and to ensure driving ability.

The other longer side region NWEL1-2 of the annular N type well NWEL1 is provided with only the N type impurity region and with no active element. The other linger side region NWEL1-2 is provided only for being connected to one longer side region NWEL1-1 to surround the P type well region PWEL in an annular manner. The reason for this is as follows. When the other longer side region NWEL1-2 is not formed, even when the deep layer N type well DNWEL is arranged, it is impossible to electrically separate the P type well PWEL and the P type substrate Psub.

In this embodiment, by the upper layer of the deep layer N type well DNWEL, the P type well PWEL and the annular N type well NWEL1 outside thereof are spaced apart from each other. This separating space G1 is for maintaining the breakdown voltage of 20V between the annular N type well NWEL1 to which 20V is applied upon erasing and the P type well PWEL to which VSS potential is set. In this embodiment, the distance of the separating space G1 is made to be 1 μm. When the breakdown voltage between the annular N type well NWEL1 and the P type well PWEL is maintained, the separating space G1 is not necessary. For example, when the design rule is 0.25 μm, the separating space G1 is not necessary, but when the design rule is 0.18 μm, it is possible to maintain breakdown voltage by the separating space G1.

Further, between the annular N type well NWEL1 and the stripe-shaped N type well NWEL2, there is also formed a separating space G2. In particular, in this separating space G2, there is not formed the deep layer N type well DPWEL in order to electrically separate the annular N type well NWEL1 and the stripe-shaped N type well NWEL2. Instead, there is formed a deep layer P type well DPWEL (which is broadly interpreted to be the first conductive type annular deep layer well). This deep layer P type well DOWEL has a somewhat higher impurity concentration than the P type substrate Psub and has a somewhat lower impurity concentration than the surface P type well PWEL, and is provided for enhancing the breakdown voltage between the annular N type well NWEL1 and the stripe-shaped N type well NWEL2. This deep layer P type sell DPWEL is arrange so as to surround the annular N type well NWEL1 shown in FIG. 18 and the stripe-shaped N type WEL2 in an annular manner.

In addition, in this embodiment, the P type impurity region 280 in a ring manner viewed in the plane (P type ring, which is broadly interpreted to be the first conductive type impurity ring) on the surface layer of the separating space G2. The formation region of this P type ring 280 surrounds, as shown in FIG. 18, both of the annular N type well NWEL1 and the stripe-shaped N type well NWEL2.

By providing the P type ring 280, even if the metal wiring that may serve as the gate of a parasitic transistor straddles over the separating space G2, the parasitic transistor is prevented from turning on and the potential inside separating space G2 is prevented from being inverted. In this embodiment, the separating space G2 has the length of 4.5 μm, and the width of the P type ring 280 positioned on the center of the separating space G2 is 0.5 μm. In order to preventing the potential inversion, the poly-silicon layer or the first layer metal wiring which may become the gate of the parasitic transistor is not formed to straddle over the separating space G2. The metal wiring up to the second layer may be such that it can straddle over the separating space G2.

Figure 21:
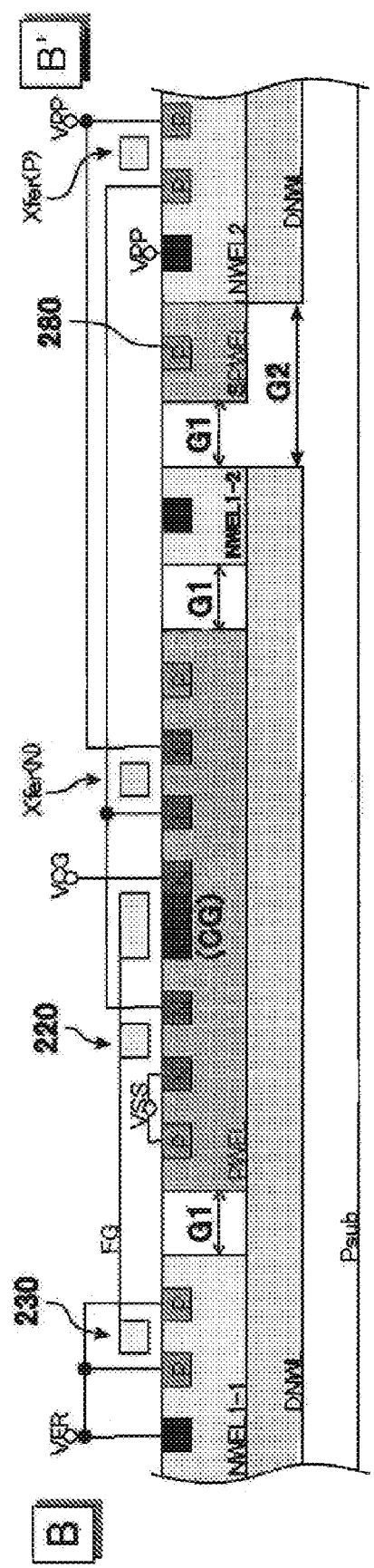
FIG. 21 is a view showing a modification of FIG. 20.

As a modification example of FIG. 20, FIG. 21 is shown. As shown in FIG. 21, in the separating space G2, instead of the annular deep layer P type well DPWEL, there is provided the annular surface layer P type well SPWEL (which is broadly interpreted to be the first conductive type annular surface layer well). The P type ring 280 is formed inside the annular surface layer P type well SPWEL. The separating space G1 (for example 1 μm) between the other longer side region NWEL1-1 of the annular N type well NWEL1 and the surface layer P type well SPWEL is provided for maintaining the breakdown voltage for the reason described above.

3.3.4. Control Circuit Block

Figure 22:
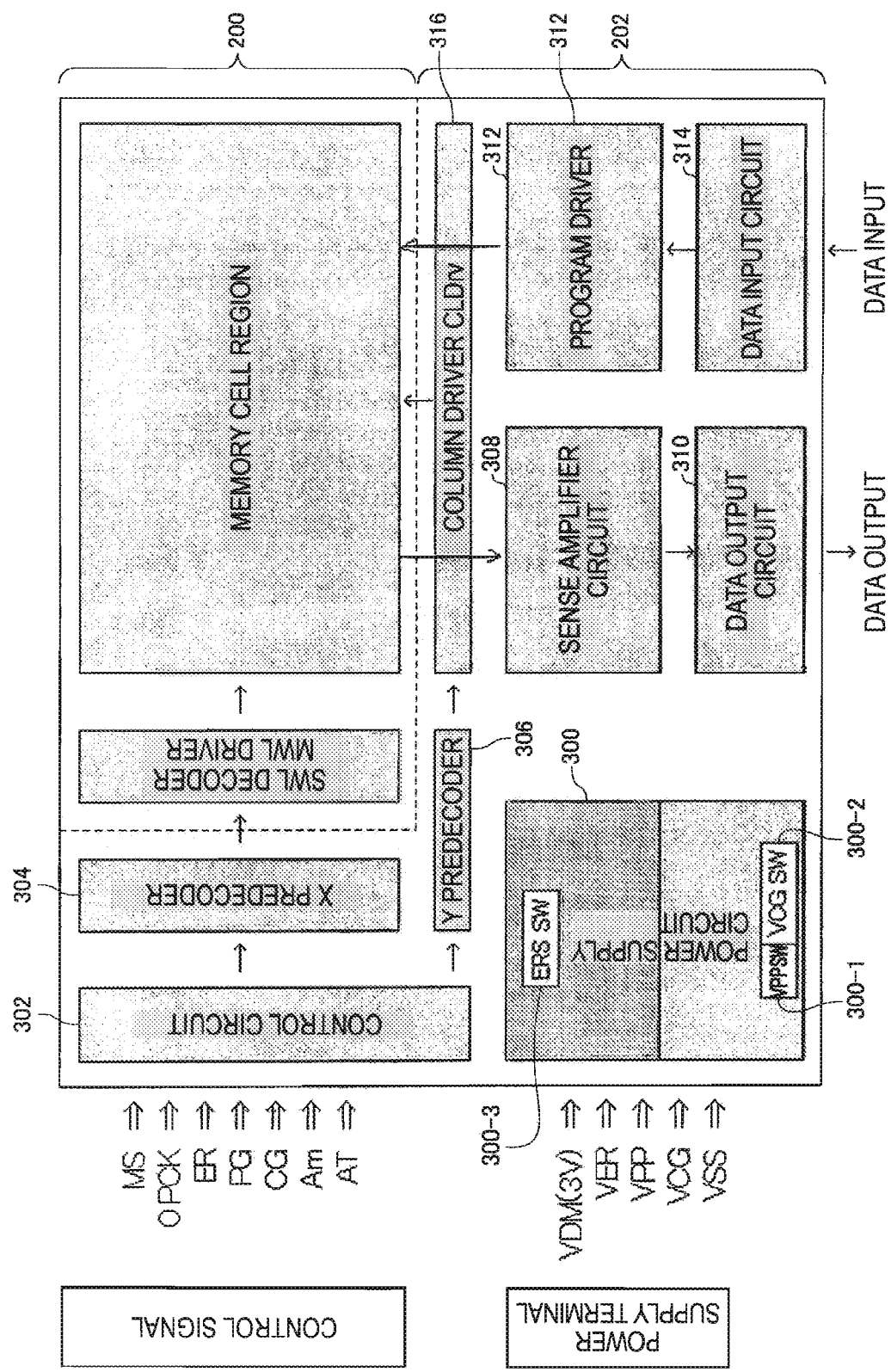
FIG. 22 is a block diagram showing the programmable ROM.
Figure 23:
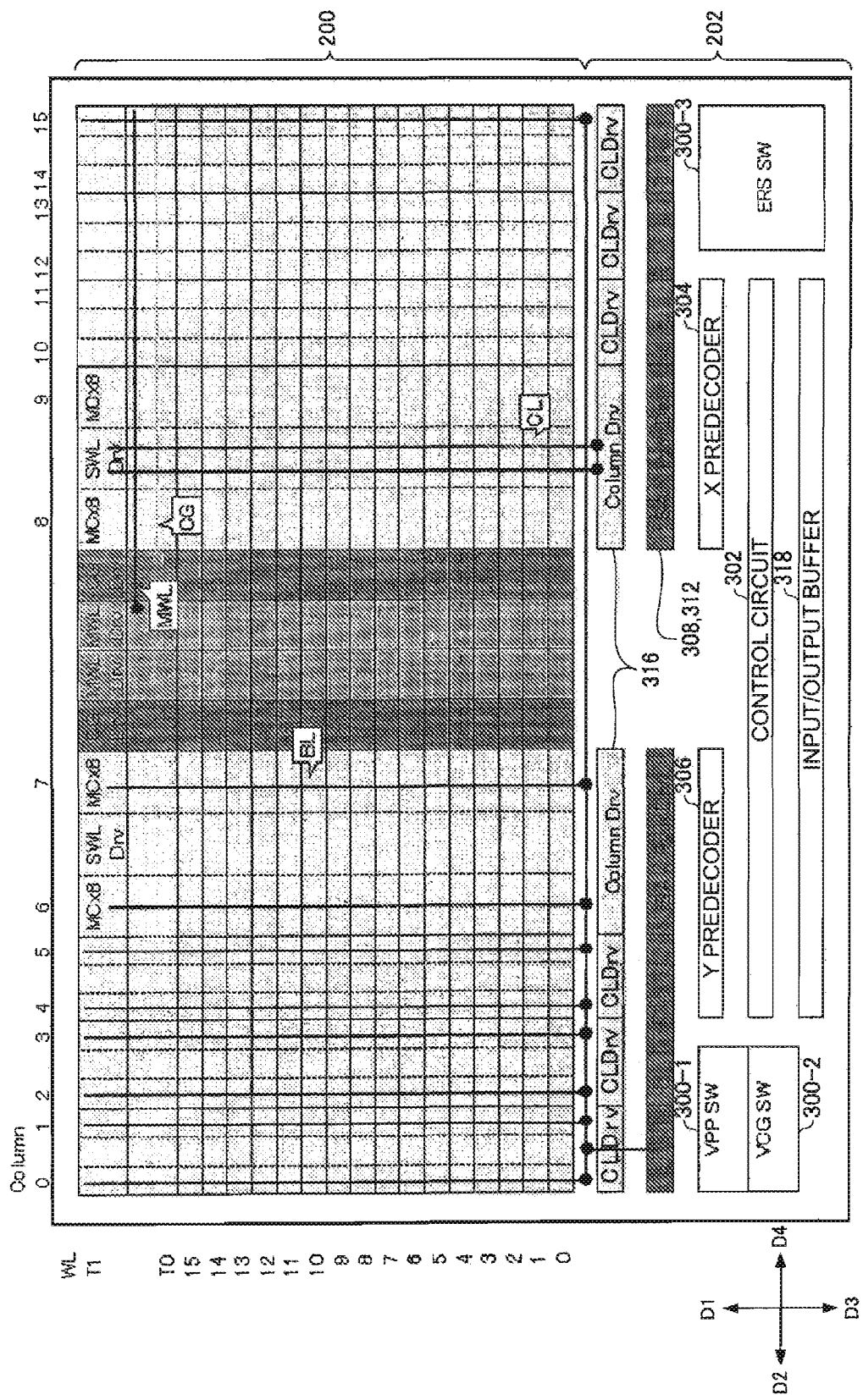
FIG. 23 is a view showing a plane layout of the entire programmable ROM.

Next, the control circuit block 202 shown in FIG. 8 will be described. FIG. 22 shows a block diagram for the control circuit block 202, and FIG. 23 is a layout view showing the control circuit block 202. The control circuit block 202 the circuit block which controls the programming (writing), reading and erasing of the data in the memory cell MC inside the memory cell array block 200. This control circuit block 202 includes, as shown in FIG. 22, the power supply circuit 300, the control circuit 302, a X predecoder 304, a Y predecoder 306, a sense amplifier circuit 308, a data output circuit 310, a program driver 312, a data input circuit 304 and the above-mentioned column driver 316 (CLDrv). An input/output buffer 318 shown in FIG. 23 includes the data output circuit 310 and the data input circuit 314 shown in FIG. 22. The power supply circuit 300 includes a VPP switch 300-1, a VCG switch 300-2, and an ERS (erase) switch 300-3.

As shown in FIG. 23, the memory cell array block 200 and the control circuit block 202 are adjacent each other in the D1 direction. The data read from the memory cell array block 200 is output in the direction in which the bit lines BL of the memory cell array block 200 extend (D1 direction) via the control circuit block 202 and through the input/output buffer 318 inside the control circuit block 202.

Here, as described with reference to FIGS. 3A and 3B, the programmable ROM 20 is arranged so as to be adjacent to the logic circuit LB or of the power supply circuit PB which is the transfer destination of the data from the programmable ROM 20 in the D1 direction. In addition, when the control circuit block 202 of the programmable ROM 20 is arranged so as to adjacent to the block of the logic circuit LB or of the power supply circuit PB which is the transfer destination of the data, it is possible to supply the data thorough shorter path.

4. Electronics

Figure 24A:
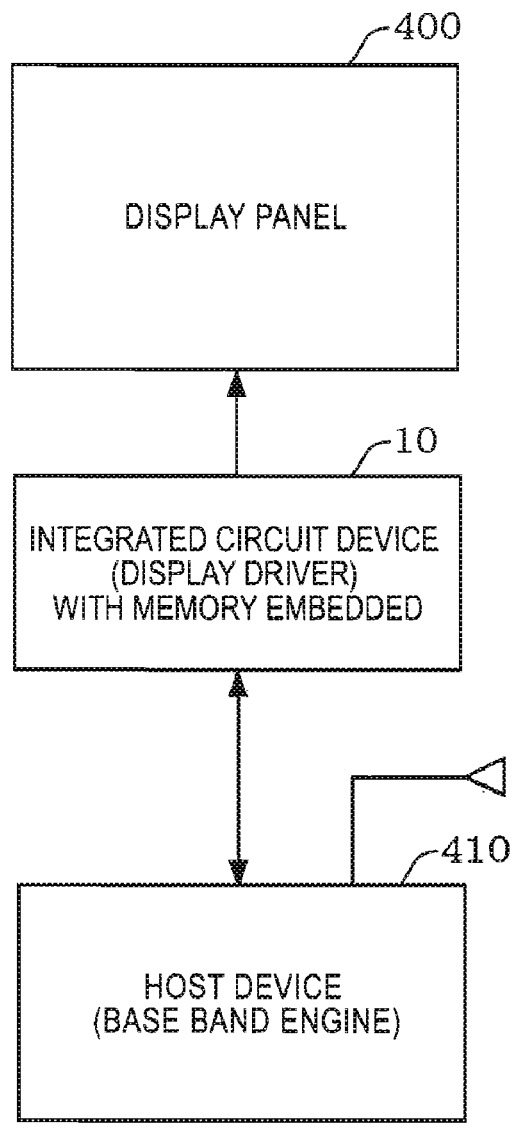
FIG. 24A is a view showing a construction example of electronic devices.
Figure 24B:
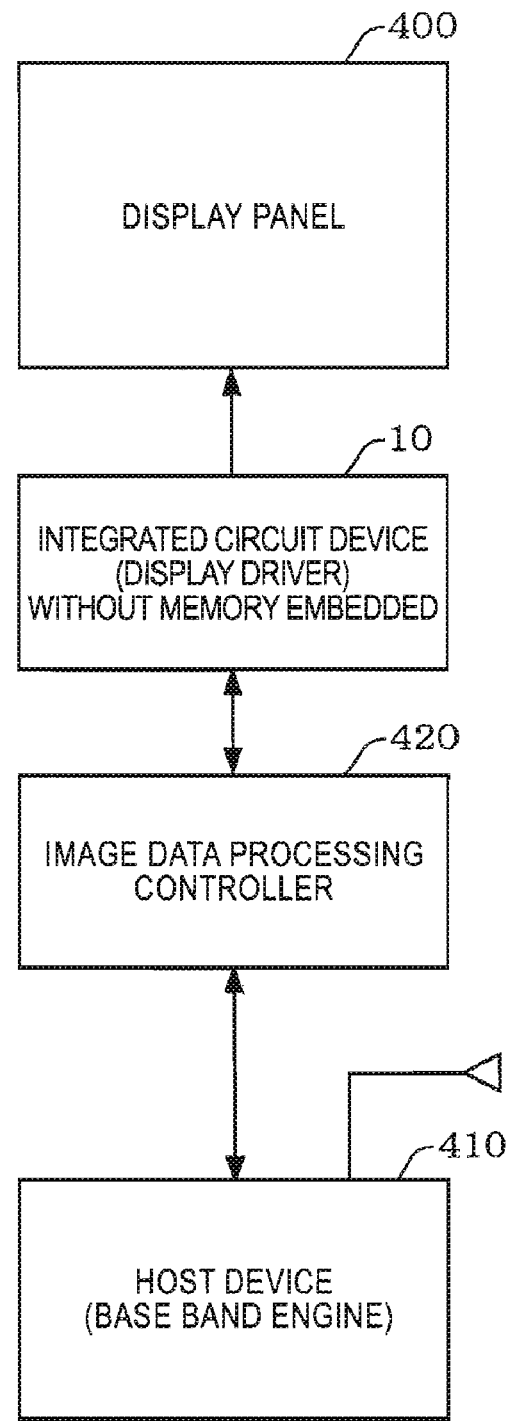
FIG. 24B is a view showing a construction example of electronic devices.

FIGS. 24A and 24 B each show an example of electronic devices (electro-optical devices) including the integrated circuit device 10 according to this embodiment. Note that the electronic devices may include other components (such as camera, operating portion and power source) than the components shown in FIGS. 24A and 24B. The electronic device according to this embodiment is not limited to the cell-phone. It may be a digital camera, a PDA, a computerized personal organizer, a computerized dictionary, a projector, a rear-projection television, or a portable terminal device.

In FIGS. 24A and 24B, a host device 410 is, for example, a Micro Processor Unit (MPU), a base band engine (base band processor) or the like. The host device 410 controls the integrated circuit device 10 as the display driver. Alternatively, the host device 410 may control the processing as an application engine or the base band engine, or the processing such as the compression, extension and sizing as a graphic engine. Further, an image processing controller (display controller) 240 shown in FIG. 24B performs, instead of the host device 410, the processing of compression, extension or sizing as the graphic engine.

The display panel 400 includes a plurality of data lines (source lines), a plurality of scanning lines (gate lines) and a plurality of pixels that are determined by the data lines and the scanning lines. Further, by changing the optical properties of the electro-optical element (which is narrowly interpreted to be a liquid crystal element), the display operation is realized. This display panel 400 is configured by the active matrix type panel using a switching element such as the TFT and TFD. The display panel 400 may be the panel other than the active matrix type panel, or the panel other than the liquid crystal panel.

In FIG. 24B, it is possible to employ the integrated circuit device 10 with memory embedded. In this case, the integrated circuit device 10 writes the image data from the host device 410 temporally in the embedded memory and then read out the temporally written image data from the embedded memory, thereby driving the display panel. On the other hand, in the case of FIG. 24B, it is possible to employ the integrated circuit device 10 without memory embedded. In this case, the image data from the host device 410 is written in the embedded memory of the image processing controller 420. Then, the integrated circuit device 10 drives the display panel 400 while being controlled by the image processing controller 420.

This embodiment has been described above. It may be easily understood by those skilled in the art that various modifications can be made without departing from the new matter and the effects of the present invention. Therefore, such modifications are to fall within the scope of the present invention. For example, the terms (for example, the output side I/F region or the input side /F region) mentioned with the different terms of broader meaning or of the same meaning at least once in the description or drawings (for example, the first interface region or the second interface region) are replaceable by those different terms at any portion in the description or the drawings. Further, the structure, arrangement and the operation of the integrated circuit or of the electronic devices are not limited to those described with reference to this embodiment. Various modifications are possible.

For example, according to the present invention, the memory cell MC constituting the programmable ROM may be one having a single gate structure using well instead of using the impurity layer NCU. Further, the memory cell MC does not necessarily have the single gate structure. It may have a two-layer gate.

Furthermore, the first conductive type of the semiconductor substrate equipped with programmable ROM is acceptable for N type.

What is claimed is:

1. An integrated circuit device, having a first direction being a direction extending from a first side which is a shorter side of the integrated circuit device to a third side opposed to the first side, and a second direction being a direction extending from a second side which is a longer side of the integrated circuit device to a fourth side opposed to the second side, comprising:

a first to a Nth circuit blocks (N is an integer more than 2) arranged in the first direction wherein, one of the first to the Nth circuit blocks is a programmable ROM block in which at least a part of data programmed is stored by a user;

the programmable ROM block includes a plurality of word lines, a plurality of bit lines, a memory cell array block that includes a plurality of memory cells connected to the plurality of word lines and the plurality of bit lines and a control circuit block that controls programming, erasing and reading data from the memory cells;

the plurality of word lines extend in the second direction;

the memory cell array block and the control block are adjacent to each other in the first direction;

the memory cell array block is divided into a first region and a second region at a center region in the second direction and has a plurality of column blocks divided in the second direction;

two word line drivers respectively driving the plurality of word lines of the first region and of the second region, and two control gate drivers respectively driving the control gates of each of the plurality of memory cells respectively arranged in the first region and the second region;

each of the plurality of word lines is hierarchized into main word lines and a plurality of sub word lines belonging to the main word line, the respective one of the plurality of sub word lines being arranged in each of the plurality of column blocks;

a word line driver arranged in the center region is the main word line driver;

each of the plurality of column blocks has a memory cell region and a sub word line decoder region, formed in a common well region of a semiconductor substrate, the sub word line decoder region further divided in the second direction, a sub word line decoder being arranged in the sub word line decoder region, the sub word line decoder selectively driving one of the plurality of sub word lines belonging to the main word line based on a state of the main word line;

each of the plurality of memory cells has a write/read transistor formed on the semiconductor substrate and a floating gate which is common for each gate of an erase transistor; and the floating gate has a single layer gate structure which is opposed to, via an insulating film, a control gate formed by an impurity layer formed in the semiconductor substrate.

2. The integrated circuit device according to claim 1, wherein the two word line drivers and the two control gate drivers are arranged in the center region.

3. The integrated circuit device according to claim 1, wherein:
   a control gate circuit block is provided with a plurality of column drivers which are arranged to respectively correspond to each of the plurality of column blocks;
   each of the plurality of column drivers selects simultaneously the sub word line decoder connected to each of the plurality of main word lines arranged in one of the column blocks to which one of the plurality of column blocks corresponds; and
   one of the plurality of main word lines is activated upon one of data programming and data reading to perform one of programming operation and reading operation for at least one of the memory cells connected to one of the sub word lines.

4. The integrated circuit device according to claim 1, wherein:
   the common well region has a triple structure and the semiconductor substrate is a first conductive type,
   the common well region including:
   a second conductive type deep layer well formed in the semiconductor substrate;
   a first conductive type surface well formed on the second conductive type deep layer well;
   a second conductive type annular surface well surrounding the first conductive type surface well on the second conductive type deep layer well; and
   an uppermost impurity region formed on the first conductive type surface well and the second conductive type annular surface well.

5. The integrated circuit device according to claim 4, wherein:
   the erase transistor is formed in the second conductive type annular surface well; and
   the control gate and the write/read transistor are formed in the first conductive type surface well.

6. The integrated circuit device according to claim 5, wherein:
   the first conductive type surface well and the second conductive type annular surface well are spaced apart from each other; and
   the second conductive type deep layer well is formed between the first conductive type surface well and the second conductive annular surface well.

7. The integrated circuit device according to claim 5, further comprising a transfer gate between the write/read transistor and the bit lines, the transfer gate being composed of a first conductive type transistor and a second conductive type transistor.

8. The integrated circuit device according to claim 7, wherein the second conductive type transistor is formed in the first conductive type surface well.

9. The integrated circuit device according to claim 8, wherein:
   the second conductive type annular surface well has two longer side regions;
   the erase transistor is formed on one of the two longer side regions;
   a second conductive type stripe-shaped surface well is formed to be adjacent to another of the two longer side regions; and
   the first conductive type transistor is formed in the second conductive type stripe-shaped surface well.

10. The integrated circuit device according to claim 1, further comprising:
    a first interface region provided along the fourth side at the second direction side of the first to the Nth circuit blocks; and
    a second interface region provided along the second side at a fourth direction side of the first to Nth circuit blocks, the fourth direction being a direction opposed to the second direction.

11. An electronic device, comprising:
    an integrated circuit device according to claim 1; and
    a display panel driven by the integrated circuit device.

* * * * *